(12) United States Patent
Zuniga et al.

(10) Patent No.: US 7,405,117 B2
(45) Date of Patent: *Jul. 29, 2008

(54) METHOD OF FABRICATING A LATERAL DOUBLE-DIFFUSED MOSFET (LDMOS) TRANSISTOR

(75) Inventors: Marco A. Zuniga, Fremont, CA (US); Budong You, Fremont, CA (US)

(73) Assignee: Volterra Semiconductor Corporation, Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/435,079

(22) Filed: May 15, 2006

(65) Prior Publication Data

US 2006/0205168 A1  Sep. 14, 2006

Related U.S. Application Data

(63) Continuation of application No. 10/713,316, filed on Nov. 13, 2003, now Pat. No. 7,074,659.

(51) Int. Cl.
*H01L 21/336* (2006.01)
(52) U.S. Cl. .................. 438/197; 438/301; 438/306
(58) Field of Classification Search .......... 438/133, 438/135, 136, 197, 275, 286, 301, 303, 305, 438/306
See application file for complete search history.

(56) References Cited

U.S. PATENT DOCUMENTS

| | | | |
|---|---|---|---|
| 4,769,686 A | 9/1988 | Horiuchi et al. | |
| 5,237,193 A | 8/1993 | Williams et al. | |
| 5,275,961 A | 1/1994 | Smayling et al. | |
| 5,349,225 A | 9/1994 | Redwine et al. | |
| 5,430,403 A | 7/1995 | Moyer et al. | |
| 5,610,421 A | 3/1997 | Contiero et al. | |
| 5,648,288 A | 7/1997 | Williams et al. | |
| 5,789,785 A | 8/1998 | Ravanelli et al. | |
| 5,834,851 A | 11/1998 | Ikeda et al. | |
| 5,955,746 A | 9/1999 | Kim | |
| 5,998,274 A | 12/1999 | Akram et al. | |
| 6,022,770 A | 2/2000 | Hook et al. | |
| 6,078,082 A | 6/2000 | Bulucea | |
| 6,142,375 A | 11/2000 | Belka et al. | |
| 6,160,289 A | 12/2000 | Kwon et al. | |
| 6,252,278 B1 * | 6/2001 | Hsing .................. | 257/335 |
| 6,384,643 B1 | 5/2002 | Grose et al. | |
| 6,399,468 B2 * | 6/2002 | Nishibe et al. .......... | 438/592 |
| 6,400,126 B1 | 6/2002 | Zuniga et al. | |
| 6,441,431 B1 * | 8/2002 | Efland et al. ............. | 257/335 |
| 6,489,209 B1 | 12/2002 | Shimoji et al. | |
| 6,518,835 B2 | 2/2003 | Ribo et al. | |
| 6,538,288 B2 | 3/2003 | Lee et al. | |

(Continued)

OTHER PUBLICATIONS

U.S. Appl. No. 11/232,516, filed Sep. 21, 2005, Budong You et al.

(Continued)

*Primary Examiner*—Tuan H Nguyen
(74) *Attorney, Agent, or Firm*—Fish & Richardson P.C.

(57) ABSTRACT

A method of monolithically fabricating a lateral double-diffused MOSFET (LDMOS) transistor having a source, drain, and a gate on a substrate, with a process flow that is compatible with a CMOS process flow, is disclosed.

41 Claims, 29 Drawing Sheets

U.S. PATENT DOCUMENTS

| | | | |
|---|---|---|---|
| 6,563,175 B2 | 5/2003 | Shiau et al. | |
| 6,605,844 B2 * | 8/2003 | Nakamura et al. | 257/360 |
| 6,642,697 B2 | 11/2003 | Zuniga et al. | |
| 6,831,332 B2 | 12/2004 | D'Anna et al. | |
| 6,855,985 B2 | 2/2005 | Williams et al. | |
| 6,897,525 B1 | 5/2005 | Kikuchi et al. | |
| 6,911,694 B2 | 6/2005 | Negoro et al. | |
| 6,927,453 B2 | 8/2005 | Shibib et al. | |
| 7,005,703 B2 | 2/2006 | Shibib et al. | |
| 7,038,274 B2 | 5/2006 | You et al. | |
| 7,074,659 B2 * | 7/2006 | Zuniga et al. | 438/197 |
| 7,163,856 B2 | 1/2007 | You et al. | |
| 7,220,633 B2 | 5/2007 | You et al. | |
| 2001/0009790 A1 | 7/2001 | Hsing | |
| 2001/0020731 A1 | 9/2001 | Takamura | |
| 2002/0009790 A1 | 1/2002 | Christensen et al. | |
| 2002/0011626 A1 * | 1/2002 | Croce et al. | 257/335 |
| 2002/0030238 A1 | 3/2002 | Nakamura et al. | |
| 2002/0079514 A1 | 6/2002 | Hower et al. | |
| 2002/0089790 A1 | 7/2002 | Stoebe et al. | |
| 2002/0106860 A1 | 8/2002 | Nishibe et al. | |
| 2003/0122160 A1 | 7/2003 | Houston et al. | |
| 2003/0141559 A1 | 7/2003 | Moscatelli et al. | |
| 2004/0046226 A1 | 3/2004 | Himi et al. | |
| 2004/0180485 A1 | 9/2004 | Beasom | |
| 2004/0238913 A1 | 12/2004 | Kwon et al. | |
| 2005/0006701 A1 * | 1/2005 | Sung et al. | 257/339 |
| 2005/0106791 A1 | 5/2005 | You et al. | |
| 2005/0106825 A1 | 5/2005 | You et al. | |
| 2007/0111457 A1 | 5/2007 | You et al. | |
| 2007/0166896 A1 | 7/2007 | You et al. | |

OTHER PUBLICATIONS

U.S. Appl. No. 11/031,381, filed Jan. 7, 2005, Marco A. Zuniga et al.

S. Wolf, "Silicon Processing for the VLSI Era", vol. 2—Process Integration, p. 662; Lattice Press, Sunset Beach, California 90742 (ISBN: 0-961672-4-5) (1990).

S. Wolf, "Silicon Processing in the VLSI Era", vol. 3—The Submicro MOSFET, pp. 591-593, Lattice Press, Sunset Beach, California (1995).

Webster's Collegiate Dictionary, 10th Edition, Springfield, Massachusetts (1999), p. 222.

* cited by examiner

METHOD OF FABRICATING A LATERAL DOUBLE-DIFFUSED MOSFET (LDMOS) TRANSISTOR

CROSS-REFERENCE TO RELATED APPLICATION

This application is a continuation (and claims the benefit of priority under 35 USC 120) of U.S. application Ser. No. 10/713,316, filed Nov. 13, 2003, now U.S. Pat. No. 7,074,659. The disclosure of the prior application is considered part of (and is incorporated by reference in) the disclosure of this application.

BACKGROUND

The following disclosure relates to semiconductor devices, and more particularly to a lateral double-diffused MOSFET (LDMOS) transistor.

Voltage regulators, such as DC to DC converters, are used to provide stable voltage sources for electronic systems. Efficient DC to DC converters are particularly needed for battery management in low power devices, such as laptop notebooks and cellular phones. Switching voltage regulators (or simply "switching regulators") are known to be an efficient type of DC to DC converter. A switching regulator generates an output voltage by converting an input DC voltage into a high frequency voltage, and filtering the high frequency input voltage to generate the output DC voltage. Specifically, the switching regulator includes a switch for alternately coupling and decoupling an input DC voltage source, such as a battery, to a load, such as an integrated circuit. An output filter, typically including an inductor and a capacitor, is coupled between the input voltage source and the load to filter the output of the switch and thus provide the output DC voltage. A controller, such as a pulse width modulator or a pulse frequency modulator, controls the switch to maintain a substantially constant output DC voltage.

LDMOS transistors are commonly used in switching regulators as a result of their performance in terms of a tradeoff between their specific on-resistance ($R_{dson}$) and drain-to-source breakdown voltage ($BV_{d\_s}$). Conventional LDMOS transistors are typically fabricated having optimized device performance characteristics through a complex process, such as a Bipolar-CMOS (BiCMOS) process or a Bipolar-CMOS-DMOS (BCD) process, that includes one or more process steps that are not compatible with sub-micron CMOS processes typically used by foundries specializing in production of large volumes of digital CMOS devices (e.g., 0.5 μm DRAM production technologies), as described in greater detail below. As a result, conventional LDMOS transistors are, therefore, not typically fabricated at such foundries.

A typical sub-micron CMOS process used by foundries specializing in production of large volumes of digital CMOS devices, referred to herein as sub-micron CMOS process, will now be described. A sub-micron CMOS process is generally used to fabricate sub-micron CMOS transistors—i.e., PMOS transistors and/or NMOS transistors having a channel length that is less than 1 μm. FIG. 1 shows a PMOS transistor 100 and an NMOS transistor 102 fabricated through a sub-micron CMOS process on a p-type substrate 104. The PMOS transistor 100 is implemented in a CMOS n-well 106. The PMOS transistor 100 includes a source region 108 and a drain region 110 having p-doped p+ regions 112 and 114, respectively. The PMOS transistor 100 further includes a gate 116 formed of a gate oxide 118 and a polysilicon layer 120. The NMOS transistor 102 is implemented in a CMOS p-well 122. The NMOS transistor 102 includes a source region 124 and a drain region 126 having n-doped n+ regions 128 and 130, respectively. The NMOS transistor 102 further includes a gate 132 formed of a gate oxide 134 and a polysilicon layer 136.

FIG. 2 illustrates a sub-micron CMOS process 200 that can be used to fabricate large volumes of sub-micron CMOS transistors (such as the CMOS transistors shown in FIG. 1). The process 200 begins with forming a substrate (step 202). The substrate can be a p-type substrate or an n-type substrate. Referring to FIG. 1, the CMOS transistors are fabricated on a p-type substrate 104. A CMOS n-well 106 for the PMOS transistor and a CMOS p-well 122 for the NMOS transistor are implanted into the substrate (step 204). The gate oxide 118, 134 of each CMOS transistor is formed, and a CMOS channel adjustment implant to control threshold voltages of each CMOS transistor is performed (step 206). A polysilicon layer 120, 136 is deposited over the gate oxide 118, 134, respectively (step 208). The p+ regions of the PMOS transistor and the n+ regions of the NMOS transistor are implanted (step 210). The p+ regions 112, 114 and n+ regions 128, 130 are highly doped, and provide low-resistivity ohmic contacts. In a sub-micron CMOS process, formation of an n+ region typically occurs through a three-step process in a single masking and photolithography step as follows: 1) a lightly doped n-type impurity region is implanted, 2) an oxide spacer is formed, and 3) a heavily doped n+ impurity region is implanted. Formation of a p+ region occurs in a similar manner. The formation such n+ and p+ regions allow transistors to have an improved hot carrier performance.

Foundries specializing in production of large volumes of digital CMOS devices generally have fixed parameters associated with the foundries' sub-micron CMOS process. These fixed parameters are typically optimized for the mass production of digital sub-micron CMOS transistors. For example, in process step 206, the CMOS channel adjustment implant generally has an associated thermal budget that is typically fixed, and has parameters optimized for mass production of sub-micron CMOS transistors.

As discussed above, conventional LDMOS transistors typically achieve optimized device performance through a complex process, such as a BiCMOS process or a BCD process, that includes one or more process steps that are not compatible with a sub-micron CMOS process optimized for the mass production of digital sub-micron CMOS transistors.

FIG. 3A shows a conventional LDMOS transistor 300 fabricated through a BiCMOS process on a p-type substrate 302. The LDMOS transistor 300 includes source region 304 with an n-doped n+ region 306, a p-doped p+ region 308, and a p-doped P-body diffusion (P-body) 310. The LDMOS transistor 300 also includes a drain region 312 with an n-doped n+ region 314 and an n-type well (HV n-well) 316, and a gate 318, including a gate oxide 320 and a polysilicon layer 322.

In the BiCMOS process, the gate oxide 320, and gate oxide of any CMOS transistors fabricated in the BiCMOS process, is formed prior to implantation of the n+ region 306 and the P-body 310. The BiCMOS process, therefore, allows the gate 318 to serve as a mask during implantation of the n+ region 306 and the P-body 310—i.e., the n+ region 306 and the P-body 310 are self aligned with respect to the gate 318. The self aligned lateral double diffusion of the n+ region 306 and the P-body 310 forms the channel of the LDMOS transistor 300.

Such kinds of self aligned double diffusions are not easily integrated into a sub-micron CMOS process because the subsequent drive-in step (or thermal budget) associated with self aligned double diffusions disrupts the fixed thermal budget associated with sub-micron CMOS process steps (e.g., process step 206) and requires a redesign of the thermal budget allocated to the sub-micron CMOS process steps. That is, the self aligned double diffusions generally includes a drive-in step with a long duration and a high temperature that can cause the characteristics of sub-micron CMOS transistors (e.g., threshold voltages) to shift.

The lateral doping profile in region (a) of the LDMOS transistor 300 controls the tradeoff between the on-resistance $R_{dson}$ and the drain-to-source breakdown voltage $BV_{d\_s}$. The vertical doping profile in region (b) determines the drain-to-substrate breakdown voltage $BV_{d\_sub}$ of the LDMOS transistor, and the pinch-off doping profile in region (c) determines the source-to-substrate punch-through breakdown voltage $BV_{s\_sub}$ of the LDMOS transistor. The source-to-substrate punch-through breakdown voltage $BV_{s\_sub}$ is an important parameter for an LDMOS transistor with a floating operation requirement, e.g., an LDMOS transistor implemented as a high-side control switch in a synchronous buck circuit configuration.

FIG. 3B shows a conventional LDMOS transistor 330 fabricated through a BCD process on a p-type substrate 332. The LDMOS transistor 330 includes source region 334 with an n-doped n+ region 336, a p-doped p+ region 338, and a p-doped P-body 340. The LDMOS transistor 330 also includes a drain region 342 with an n-doped n+ region 344 and an n-type layer (HV n-Epi) 346, and a gate 348, including a gate oxide 350 and a polysilicon layer 352. As with the BiCMOS process, in the BCD process, the gate oxide 350, and gate oxide of any CMOS transistors fabricated in the BCD process, is formed prior to implantation of the n+ region 336 and the P-body 340.

In the BCD process, an n+ buried layer 354 can be grown on the p-type substrate 332 to improve the source-to-substrate punch-through breakdown characteristics of the LDMOS transistor. Such an approach offers an improved tradeoff between the on-resistance $R_{dson}$ and drain-to-source breakdown voltage $BV_{d\_s}$ of the LDMOS transistor as the lateral doping profile of the LDMOS transistor can be optimized without constrain on the vertical doping profiles. However, such a BCD process includes the growth of the HV n-Epi layer 346, and this step is generally not compatible with a sub-micron CMOS process.

Another approach used in a BCD process is to utilize an n− layer 360 implanted in the drain region 362 of the LDMOS transistor 364 as shown in FIG. 3C. The n− layer 360, n+ region 366, and P-body 368 are self aligned with respect to the gate 370—i.e., the n− layer 360, n+ region 366, and P-body 368 are implanted after formation of gate oxide 372. The inclusion of the n− layer 360 provides an additional parameter to further optimize the tradeoff between the on-resistance $R_{dson}$ and drain-to-source breakdown voltage $BV_{d\_s}$ of the LDMOS transistor. Similar to the n+ buried layer approach of FIG. 3B, the inclusion of the n− layer 360 at the surface provides a method to decouple vertical and horizontal doping constraints.

SUMMARY

In one aspect, this specification describes a method of fabricating a transistor having a source, drain, and a gate on a substrate. A first impurity region with a first volume and a first surface area is implanted into a surface of the substrate. The first impurity region is of a first type. A gate oxide is formed between the source region and a drain region of the transistor. The gate oxide is covered with a conductive material. A second impurity region is implanted into a source region of the transistor. The second impurity region has a second volume and a second surface area in the first surface area of the first impurity region, and is of an opposite second type relative to the first type. Implanting the second impurity region includes a first implant to limit a vertical depth of the second impurity region and a second implant separate from the first implant to control a lateral channel length of the transistor. A third impurity region and a fourth impurity region are implanted into the source region of the transistor. The third impurity region has a third volume and a third surface area in the second surface area of the second impurity region, and is of the first type. The fourth impurity region has a fourth volume and a fourth surface area in the second surface area of the second impurity region, and is of the opposite second type. A fifth impurity region is implanted into the drain region of the transistor. The fifth impurity region has a fifth volume and a fifth surface area, and is of the first type.

Implementations may include one or more of the following features. The first implant to limit the vertical depth of the second impurity region can occur prior to formation of the gate oxide of the transistor, and the second implant to control the lateral channel length of the transistor can occur after the formation of the gate oxide of the transistor. Alternatively, the first implant to limit the vertical depth of the second impurity region and the second implant to control the lateral channel length of the transistor can both occur after formation of the gate oxide of the transistor. The first implant can be a high energy implant. The first implant can also be a large angle tilt implant. The first implant can be deeper than the second implant.

A sixth impurity region can be implanted into the drain region of the transistor. The sixth impurity region can have a sixth volume and a sixth surface area in the first surface area of the first impurity region. The sixth impurity region can be implanted with a spacing from the second impurity region and be of the first type. The sixth impurity region can be self aligned to the gate of the transistor and be implanted after forming the gate oxide of the transistor. Alternatively, the sixth impurity region can be non-self aligned to the gate of the transistor and be implanted prior to forming of the gate oxide of the transistor. The spacing of the second impurity region from the sixth impurity region can be sized such that the sixth impurity region is spaced a distance (d) away from the gate of the transistor as measured along a surface of the transistor. The first impurity region and the sixth impurity region can be implanted using a same mask. The implantation of the fifth impurity region can be defined by a slit mask, and therefore the fifth impurity region can form multiple implants spaced apart relative to each other along a surface of the transistor in the drain region of the transistor. The third impurity region, the fifth impurity region, and the sixth impurity region can be implanted simultaneously using the slit mask.

A seventh impurity region can be implanted into the source region of the transistor. The seventh impurity region can have a seventh volume having a seventh surface area, and be of the first type. An eight impurity region can be implanted into the drain region of the transistor. The eighth impurity region can have an eighth volume having an eighth surface area, and be of the first type. A field oxide can be formed on the drain region of the transistor. The transistor can be an LDMOS transistor.

Advantages of the invention may include the following. The method of fabricating a transistor having a double-diffused source region is compatible with mainstream sub-micron CMOS fabrication process technologies offered by foundries specializing in mass volume production (e.g., foundries specializing in mass production of digital sub-micron CMOS devices). That is, foundries specializing in mass production of sub-micron CMOS technologies do not have to disrupt (or change) fixed CMOS process parameters that have been optimized for the production of mass volumes the digital sub-micron CMOS devices. Production of conventional LDMOS transistors can, therefore, be seamlessly integrated into sub-micron CMOS production technologies. The LDMOS transistor can be fabricated in a process that is compatible with a sub-micron CMOS process, using a lower mask count than conventional BiCMOS and BCD processes. Integrated circuits including LDMOS transistors, e.g., a switching regulator, can be monolithically integrated onto a single chip using a sub-micron CMOS process. An input voltage source to a switching regulator having one or more LDMOS transistors can be optimized for different applications, and the fabrication process for the LDMOS transistors can be adjusted accordingly.

The details of one or more embodiments of the invention are set forth in the accompanying drawings and the description below. Other features and advantages of the invention will be apparent from the description and drawings, and from the claims.

DESCRIPTION OF DRAWINGS

Like reference symbols in the various drawings indicate like elements.

DETAILED DESCRIPTION

Figure 1:
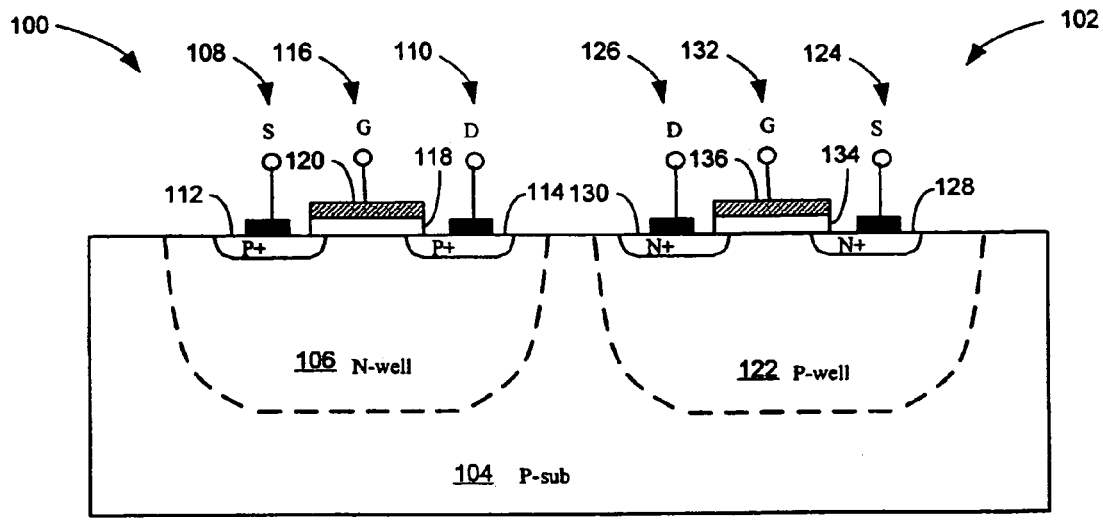
FIG. 1 is a schematic cross-sectional view of a conventional PMOS transistor and NMOS transistor formed on a p-type substrate.
Figure 2:
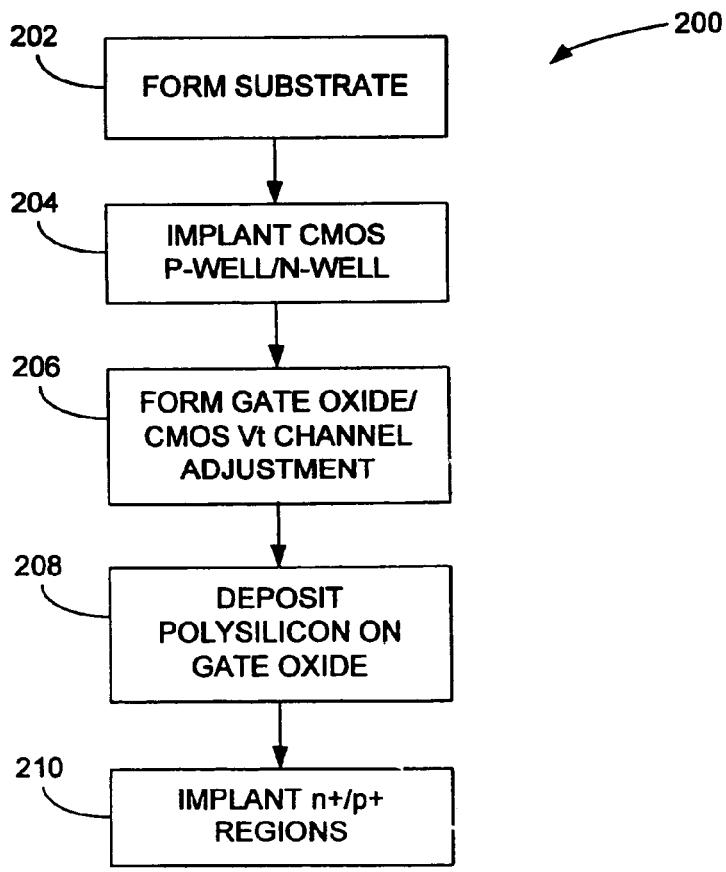
FIG. 2 is a flow diagram illustrating a conventional sub-micron CMOS process for manufacturing CMOS transistors.
Figure 3A:
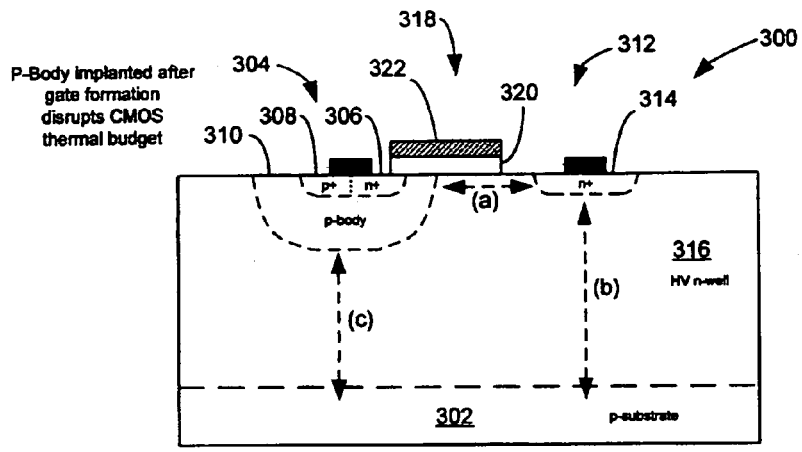
FIGS. 3A, 3B, and 3C are schematic cross-sectional views of conventional LDMOS transistors.
Figure 3B:
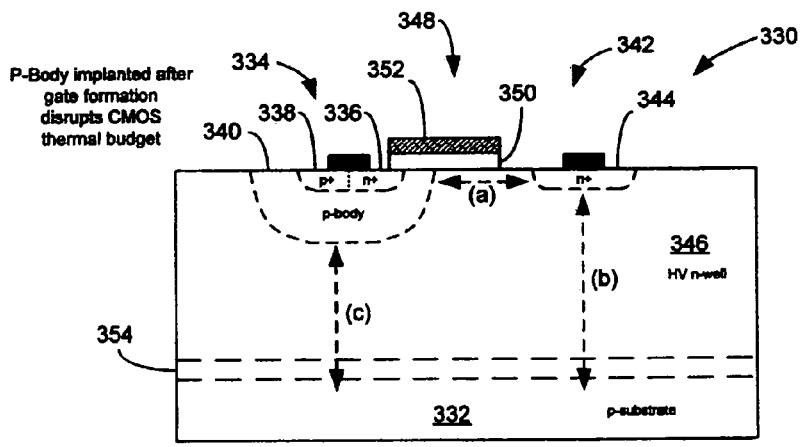
Figure 3C:
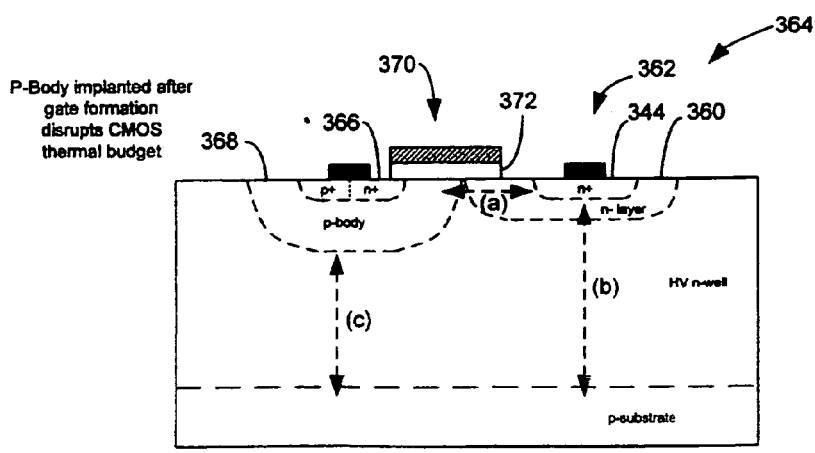
Figure 4:
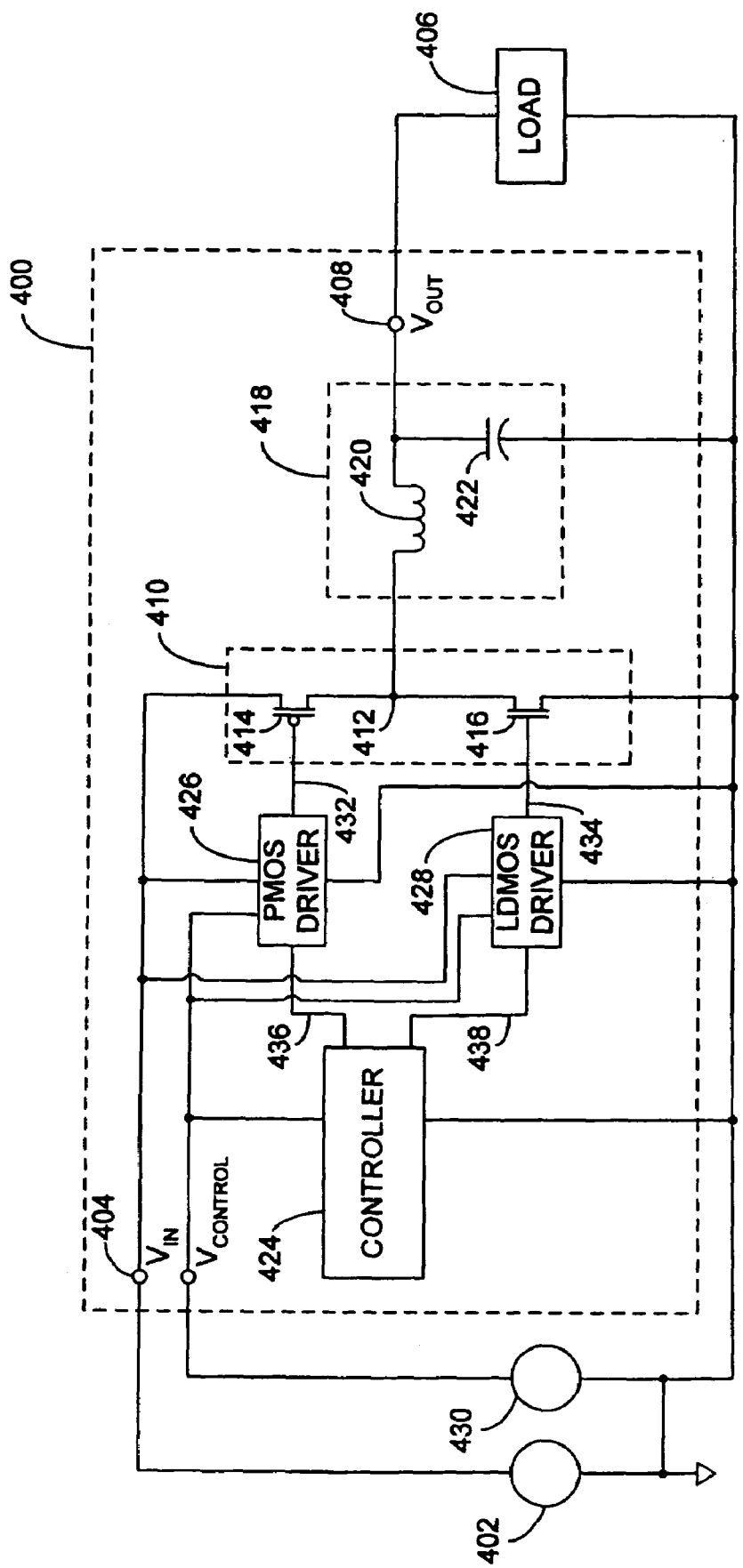
FIG. 4 is a block diagram of a buck switching regulator.

FIG. 4 is a block diagram of a switching regulator 400 including an LDMOS transistor according to one implementation. Conventional LDMOS transistors typically achieve optimized device performance through a complex process, such as a BiCMOS process or a BCD process, that includes one or more process steps not compatible with a sub-micron CMOS process optimized for the mass production of digital sub-micron CMOS transistors. According to one aspect, an LDMOS transistor is provided that can be fabricated through a process that can be seamlessly integrated into a typical sub-micron CMOS process.

Referring to FIG. 4, an exemplary switching regulator 400 is coupled to a first high DC input voltage source 402, such as a battery, by an input terminal 404. The switching regulator 400 is also coupled to a load 406, such as an integrated circuit, by an output terminal 408. The switching regulator 400 serves as a DC-to-DC converter between the input terminal 404 and the output terminal 408. The switching regulator 400 includes a switching circuit 410 which serves as a power switch for alternately coupling and decoupling the input terminal 404 to an intermediate terminal 412. The switching circuit 410 includes a rectifier, such as a switch or diode, coupling the intermediate terminal 412 to ground. Specifically, the switching circuit 410 may include a first transistor 414 having a source connected to the input terminal 404 and a drain connected to the intermediate terminal 412 and a second transistor 416 having a source connected to ground and a drain connected to the intermediate terminal 412. The first transistor 414 may be a Positive-Channel Metal Oxide Semiconductor (PMOS) transistor, whereas the second transistor 416 may be an LDMOS transistor.

The intermediate terminal 412 is coupled to the output terminal 408 by an output filter 418. The output filter 418 converts the rectangular waveform of the intermediate voltage at the intermediate terminal 412 into a substantially DC output voltage at the output terminal 408. Specifically, in a buck-converter topology, the output filter 418 includes an inductor 420 connected between the intermediate terminal 412 and the output terminal 408 and a capacitor 422 connected in parallel with the load 406. During a PMOS conduction period, the first transistor is closed, and the voltage source 402 supplies energy to the load 406 and the inductor 420 through the first transistor 414. On the other hand, during an LDMOS transistor conduction period, the second transistor 416 is closed, and current flows through the second transistor 416 as energy is supplied by the inductor 420. The resulting output voltage $V_{out}$ is a substantially DC voltage.

The switching regulator also includes a controller 424, a PMOS driver 426 and an LDMOS driver 428 for controlling the operation of the switching circuit 400. The PMOS driver 426 and the LDMOS driver are coupled to voltage source 430. A first control line 432 connects the PMOS transistor 414 to the PMOS driver 426, and a second control line 434 connects the LDMOS transistor 416 to the LDMOS driver 428. The PMOS and NMOS drivers are connected to the controller 424 by control lines 436 and 438, respectively. The controller 424 causes the switching circuit 400 to alternate between PMOS and LDMOS conduction periods so as to generate an intermediate voltage $V_{int}$ at the intermediate terminal 412 that has a rectangular waveform. The controller 424 can also include a feedback circuit (not shown), which measures the output voltage and the current passing through the output terminal. Although the controller 424 is typically a pulse width modulator, the invention is also applicable to other modulation schemes, such as pulse frequency modulation.

Although the switching regulator discussed above has a buck converter topology, the invention is also applicable to other voltage regulator topologies, such as a boost converter or a buck-boost converter, and to RF output amplifiers.

Figure 5A:
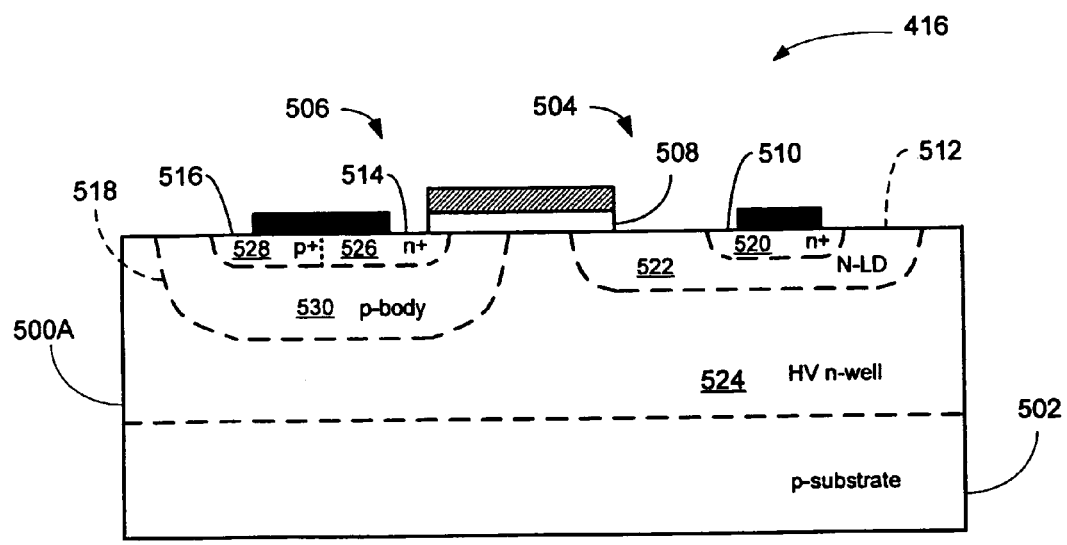
FIGS. 5A-5B are a schematic cross-sectional view of an LDMOS transistor and a three-dimensional view of the surface area of the LDMOS transistor source and drain regions, respectively.

FIG. 5A shows a schematic cross-sectional view of the LDMOS transistor 416. The LDMOS transistor 416 can be fabricated on a high voltage n-type well (HV n-well) 500A implanted in a p-type substrate 502. An HV n-well implant is typically a deep implant and is generally more lightly doped relative to a CMOS n-well. HV n-well 500A can have a retrograded vertical doping profile. The LDMOS transistor 416 includes a drain region 504, a source region 506, and a gate 508. The drain region 504 includes an n-doped n+ region 510 and an n-doped shallow drain (N-LD) 512. The source region 506 includes an n-doped n+ region 514, a p-doped p+ region 516, and a p-doped P-body 518. The HV n-well 500A, the N-LD 512, and the n+ region 510 in drain region 504 are volumes composed of doped material. Both the N-LD 512 and the HV n-well 500A have a lower concentration of impurities than the n+ regions 510, 514. However, portions at which these volumes overlap have a higher doping concentration than the individual volumes separately. A portion 520 that contains the overlapping volumes of the n+ region 510, the N-LD 512, and the HV n-well 500A has the highest doping concentration of all the overlapping volume portions. A portion 522 that contains the overlapping volumes of the N-LD 512 and the HV n-well 500A, but not the n+ region 510, has a lower doping concentration than portion 520. A portion 524 that only includes the HV n-well 500A has a lower doping concentration than either portions 520 or 522 because it does not include multiple overlapping doped volumes. Likewise, the n+ region 514, the p+ region 516, and the P-body 518 in source region 506 are volumes (526, 528, and 530, respectively) composed of doped material.

Figure 5B:
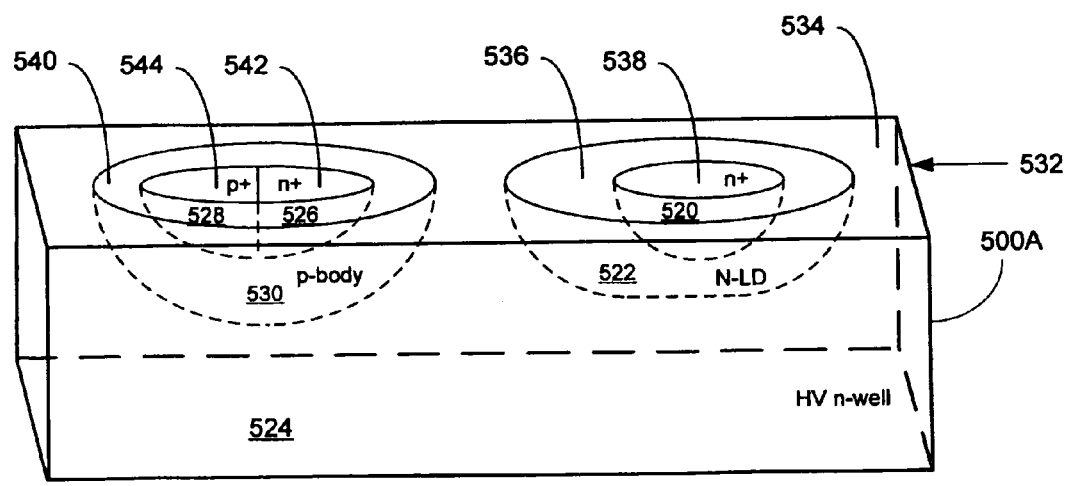

Referring to FIG. 5B, the volumes 520-530 can each have a surface area on the surface 532 of the device. The HV n-well 500A has a surface area 534. In the drain region 524, the N-LD 522 has a surface area 536 located within the surface area of the HV n-well 500A. The n+ region 510 has a surface area 538 located within the surface area 536 of the N-LD. In the source region 506, the P-body 518 has surface area 540 located within the surface area 534. The n+ region 514 and the p+ region 516 have a surface area 542 and 544, respectively, that is located within the surface area 540 of the P-body.

Figure 6:
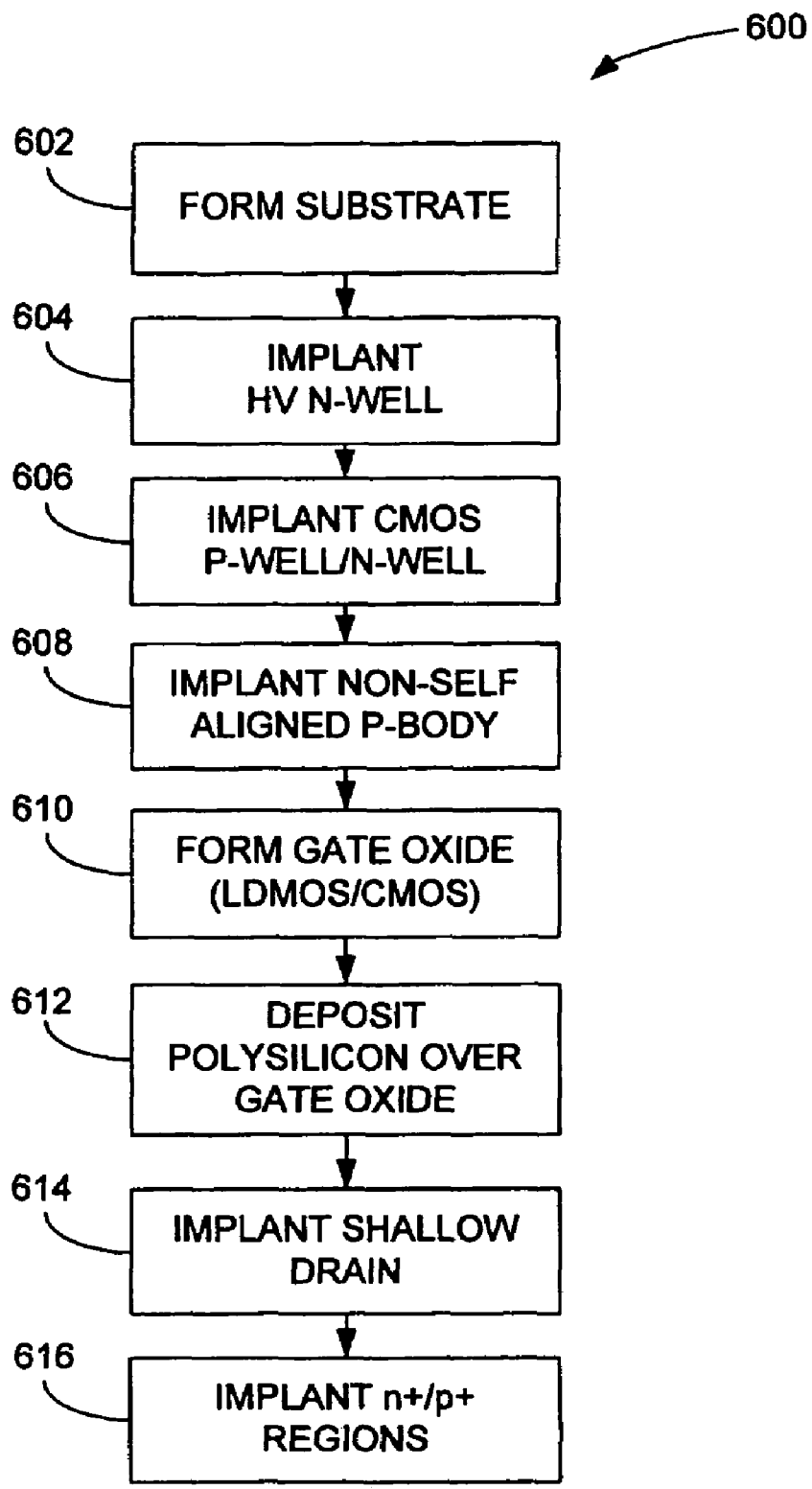
FIG. 6 is a flow diagram illustrating a process for manufacturing a semiconductor transistor, including an LDMOS transistor, that is compatible with a sub-micron CMOS process.

FIG. 6 illustrates a process 600 of fabricating a semiconductor device, including an LDMOS transistor, a PMOS transistor with floating operation capability (i.e., the source of the transistor is not grounded), and an NMOS transistor with floating operation capability, that is compatible with a submicron CMOS process. Conventional CMOS transistors can also be fabricated through process 600.

Figure 7A:
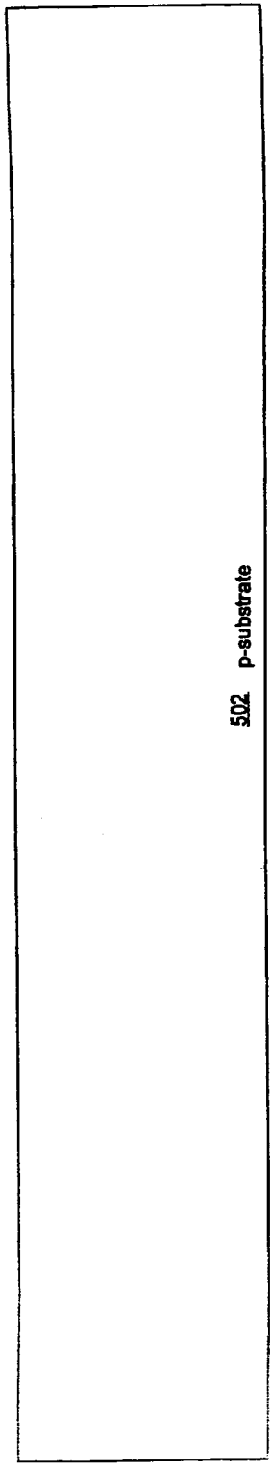
FIGS. 7A-7G illustrate the process of manufacturing an LDMOS transistor, a PMOS transistor, and an NMOS transistor according to the process of FIG. 6.
Figure 7B:
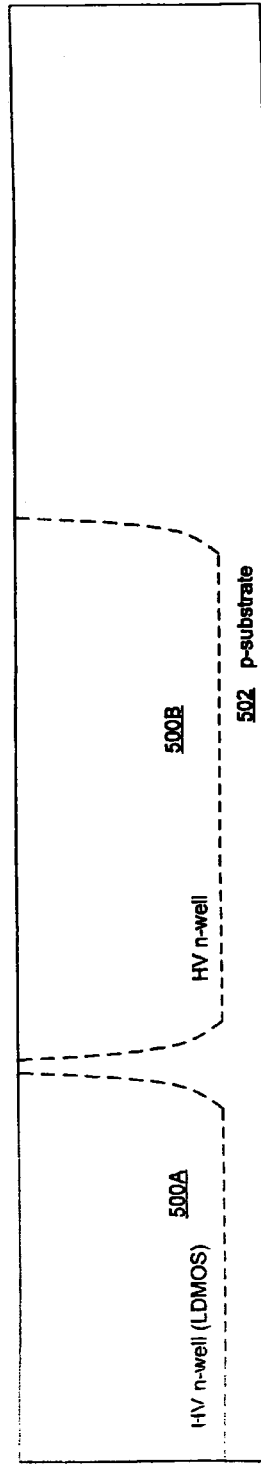
Figure 7C:
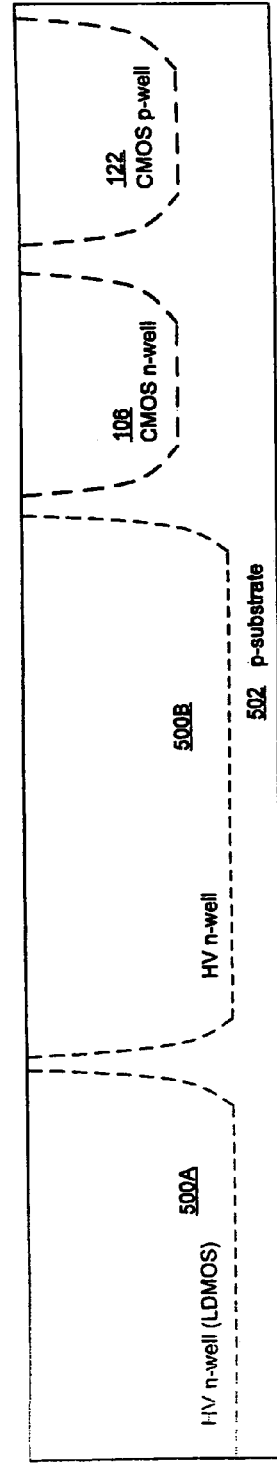
Figure 7D:
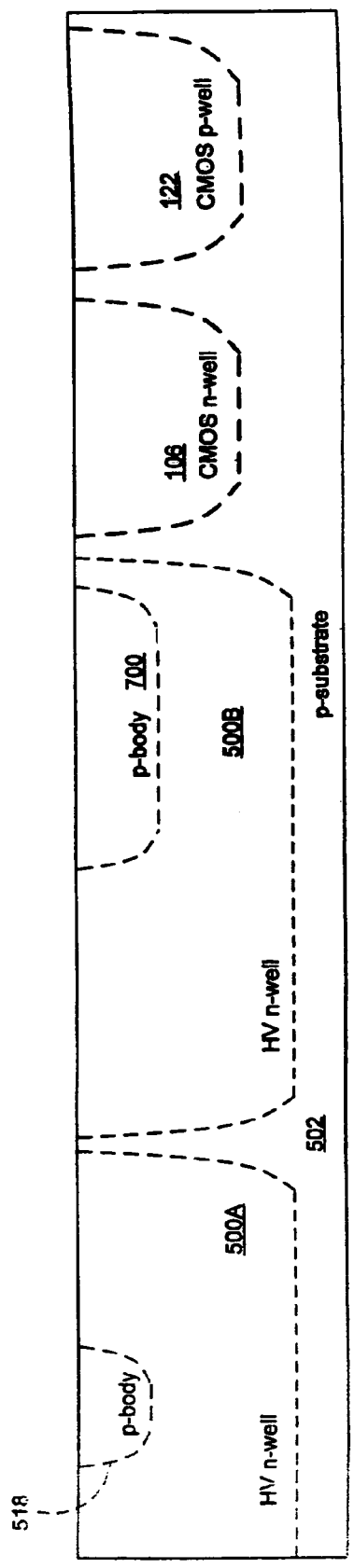

The process 600 begins with forming a substrate (step 602). The substrate can be a p-type substrate or an n-type substrate. Referring to the example of FIG. 7A, a semiconductor layer consisting of a p-type substrate 502 is formed. An HV n-well 500A-B for the LDMOS transistor, the PMOS transistor with floating operation capability, and NMOS transistor with floating operation capability, is implanted into the substrate (step 604). As shown in FIG. 7B, a separate HV n-well 500A can be implanted for the LDMOS transistor. A CMOS n-well 106 for a conventional PMOS transistor and a CMOS p-well 122 for a conventional NMOS transistor are implanted into the substrate (step 606) (FIG. 7C). A non-self aligned P-body 518 for the drain region of the LDMOS transistor is implanted (step 608). As shown in FIG. 7D, the P-body 518 is implanted into the HV n-well 500A. During step 706, a P-body can also be implanted for the NMOS transistor with floating operation capability. Referring again to FIG. 7D, a P-body 700 for the NMOS transistor with floating operation capability is implanted into the HV n-well 500B.

Figure 8A:
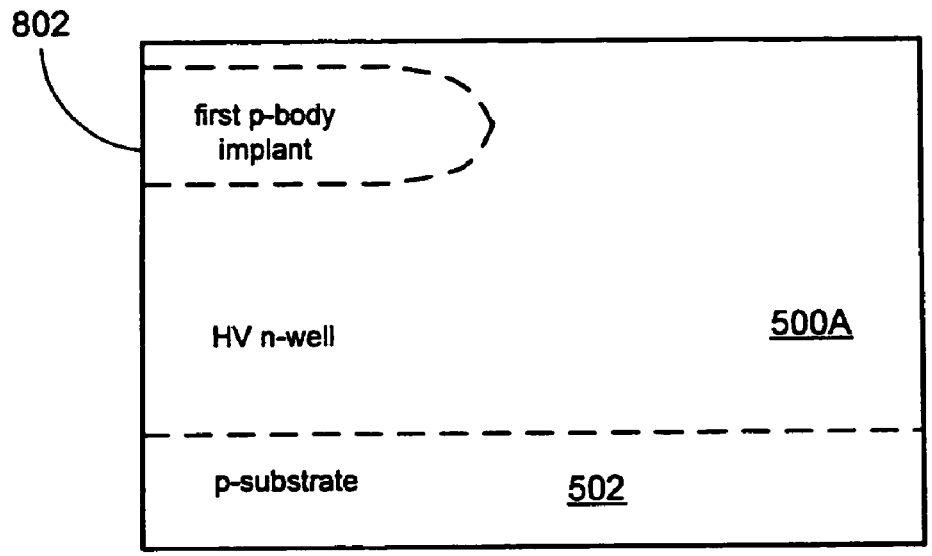
FIGS. 8A-8C illustrate a P-body implant step of the process of FIG. 6 according to one implementation.
Figure 8B:
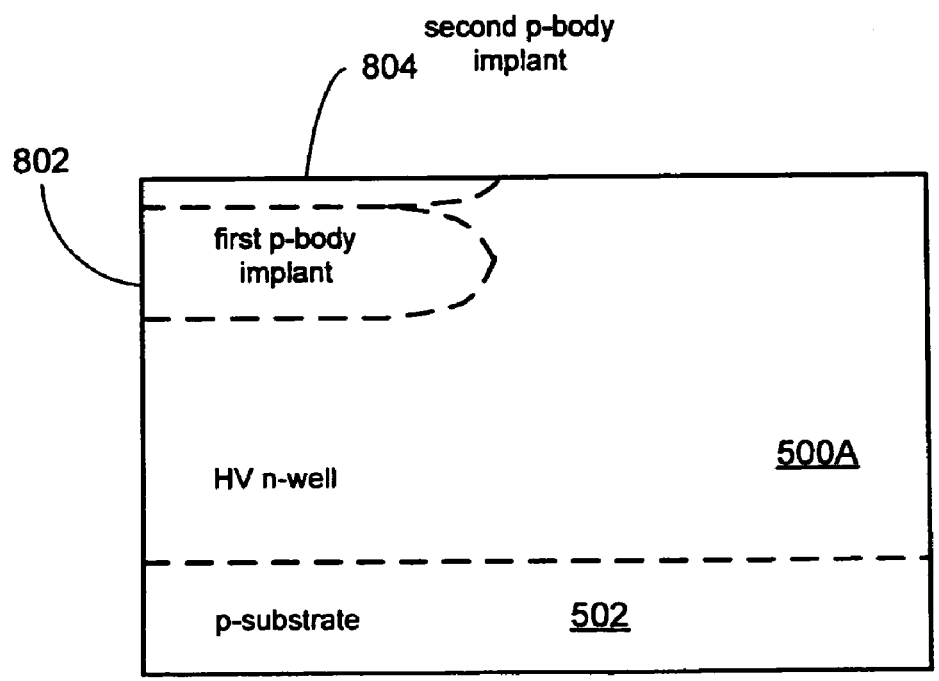
Figure 8C:
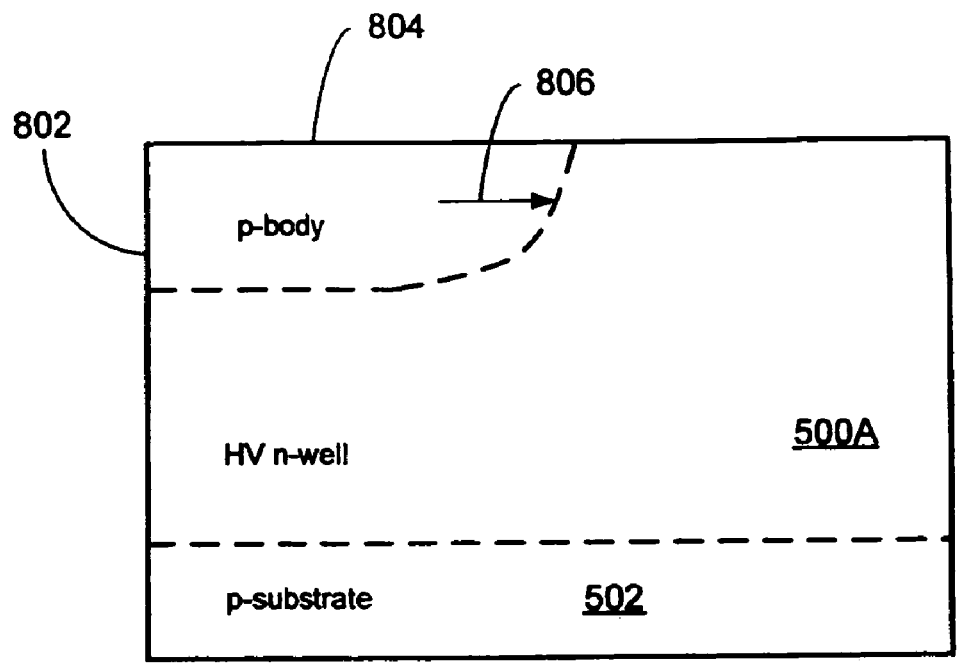

In one implementation, the non-self aligned P-body 518 is implanted into the HV n-well 500A in two separate steps to allow for a better control of vertical depth and amount of lateral side diffusion of the P-body. Referring to FIG. 8A, a first P-body implant 802 into the HV n-well 500A limits the vertical depth of the P-body. The vertical depth of the first P-body implant 802 controls the vertical doping profile underneath the source region of the LDMOS transistor, and therefore determines the source-to-substrate punch-through breakdown voltage $BV_{s\_sub}$ of the LDMOS transistor. The first P-body implant can be a high energy implant. In one implementation, the first P-body implant 802 is implanted using a large-angle tilt (LAT) implant process. A normal angle implant tilt is typically 7 degrees. A LAT is typically larger than 7 degrees. As shown in FIG. 8B, a second P-body implant 804 is implanted over the first P-body implant 802. The second P-body implant 804 controls the channel length. The second P-body implant 804 also sets the surface concentration of the P-body to control the threshold voltage ($V_t$) of the LDMOS transistor. A subsequent P-body drive-in and annealing process that limits the amount of the lateral side diffusion 806 of the P-body (for further channel length control) is shown in FIG. 8C. In one implementation, the subsequent annealing process is a rapid thermal anneal (RTA) process.

Figure 7E:
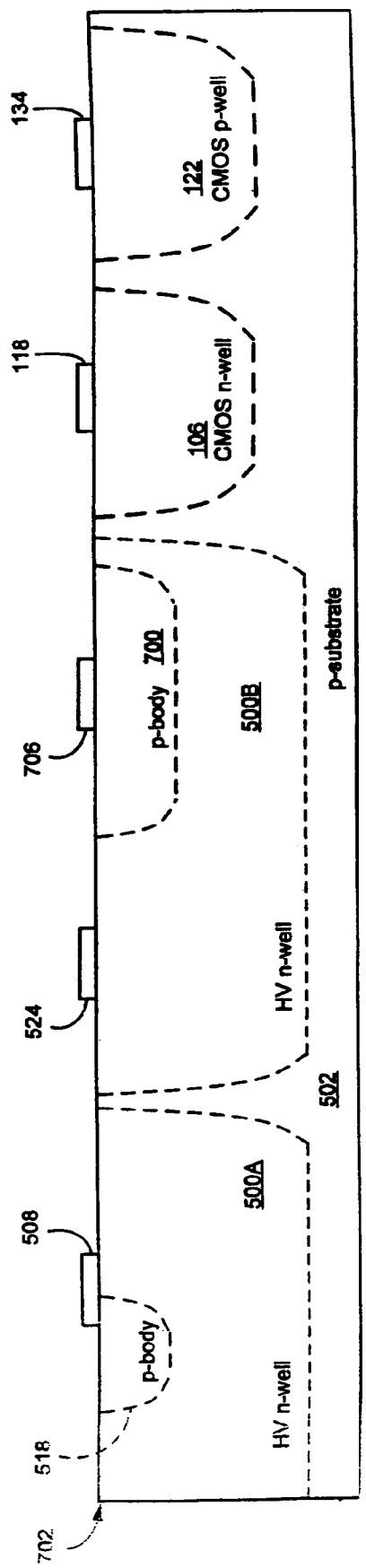
Figure 7F:
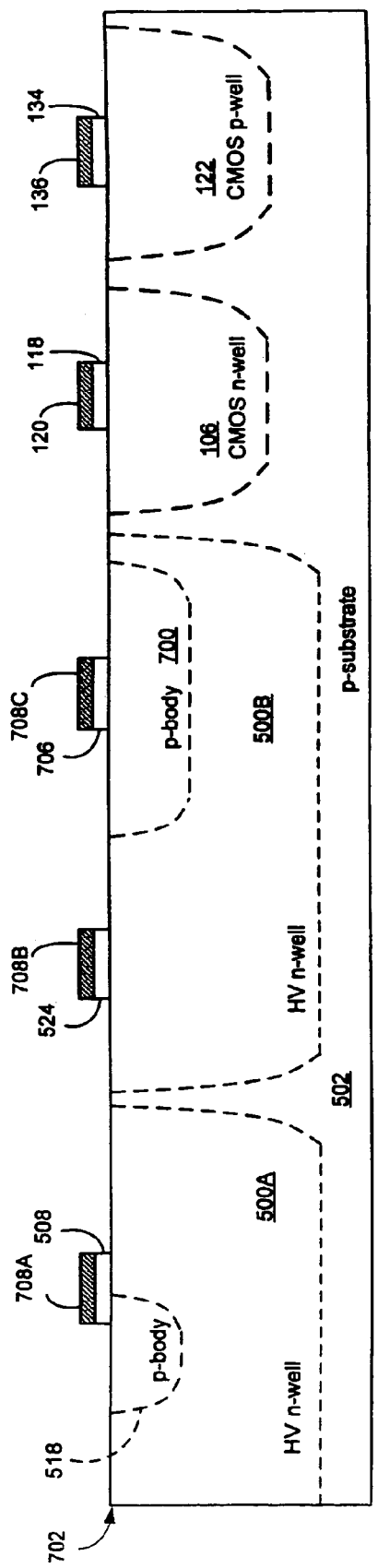

The gate oxide for each of the LDMOS transistor, the PMOS transistor with floating operation capability, and the NMOS transistor with floating operation capability, and the conventional CMOS transistors, is formed (step 610). The gate oxide for the LDMOS transistor can be formed at the same time as a gate oxide of the conventional CMOS transistors. The LDMOS transistor can, therefore, have a similar threshold voltage and gate oxide thickness and as the conventional CMOS transistors, and can be driven directly by conventional CMOS logic circuits. Alternatively, the gate oxide of the LDMOS transistor can formed at a different time than the gate oxide of the conventional CMOS transistors to allow the LDMOS transistor to be implemented with a dedicated thick gate oxide. When implemented with a thick gate oxide, the LDMOS transistor allows for higher gate drive in applications where a lower voltage power supply may not be readily available. This flexibility allows for optimization of the LDMOS transistor depending on specific requirements of a power delivery application, such as efficiency targets at a particular frequency of operation. Referring to the example of FIG. 7E, the LDMOS gate oxide 508 is formed on a surface 702 of the substrate over an inner edge 704 of the P-body 518. The gate oxide 524 of the PMOS transistor (with floating operation capability) is formed on the surface of the substrate on the HV n-well 500B. The gate oxide 706 of the NMOS transistor (with floating operation capability) is also formed on the surface of the substrate on the HV n-well 500B. The gate oxide 118 of the conventional PMOS transistor is formed on the surface of the substrate on the CMOS n-well 106. The gate oxide 134 of the conventional NMOS transistor is formed on the surface of the substrate on the CMOS p-well 122. A polysilicon layer is deposited over the gate oxide (step 510). As shown in FIG. 7F, a polysilicon layer 708A-C is deposited over the LDMOS gate oxide 508, the PMOS gate oxide 524, the NMOS gate oxide 706, respectively. A polysilicon layer 120 is deposited over the conventional PMOS gate oxide 118, and a polysilicon layer 136 is deposited over the conventional NMOS gate oxide 134.

Figure 7G:
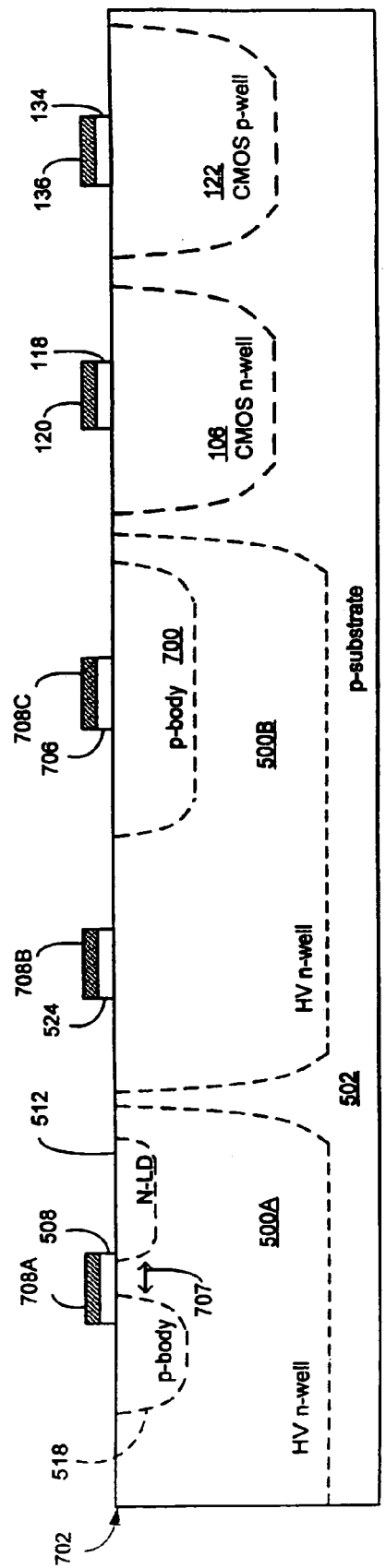
Figure 9:
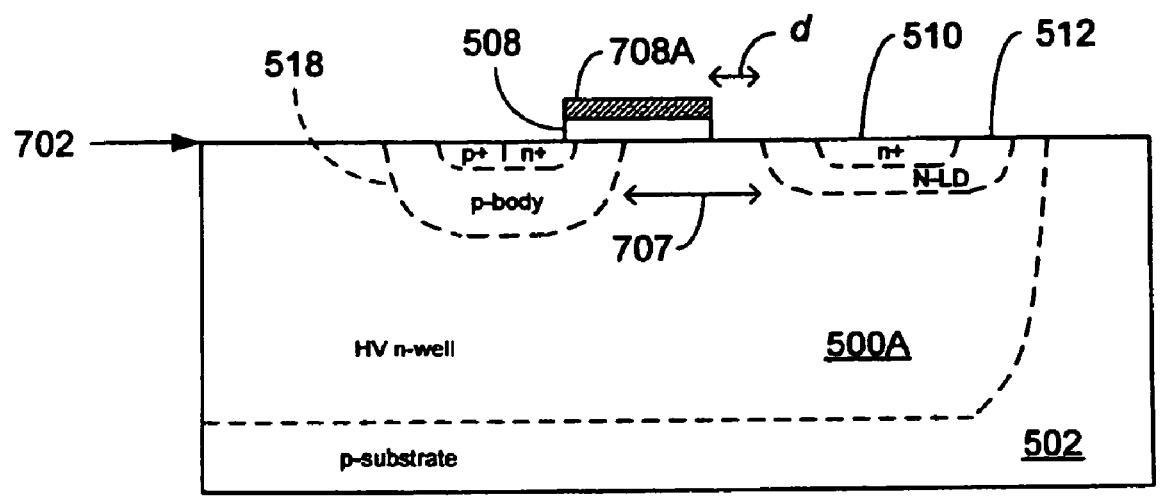
FIG. 9 illustrates a shallow drain implant according to one implementation.

A shallow drain is implanted and diffused into the drain of the LDMOS transistor (step 614). The shallow drain can be implanted before or after the LDMOS gate is formed—i.e., the shallow drain can be non-self aligned or self aligned with respect to the LDMOS gate. The shallow drain can be implanted through a LAT implant or a normal angle tilt implant. In the example of FIG. 7G, the shallow drain is the n-doped shallow drain N-LD 512. The shallow drain implant N-LD 512 has a spacing 707 from the P-body implant that is controlled by masked gate dimensions. The spacing 707 can be sized such that that the N-LD 512 implant extends a predetermined distance d from the LDMOS gate as shown in FIG. 9. The predetermined distance d can be controlled by mask dimensions. In one implementation, the N-LD implant shares the same mask as the HV n-well to reduce the mask count. Such an approach is possible if the doping concentration of N-LD is lighter than the P-body so that the extra N-LD implant into the source of the LDMOS transistor does not affect the channel characteristics.

Figure 7H:
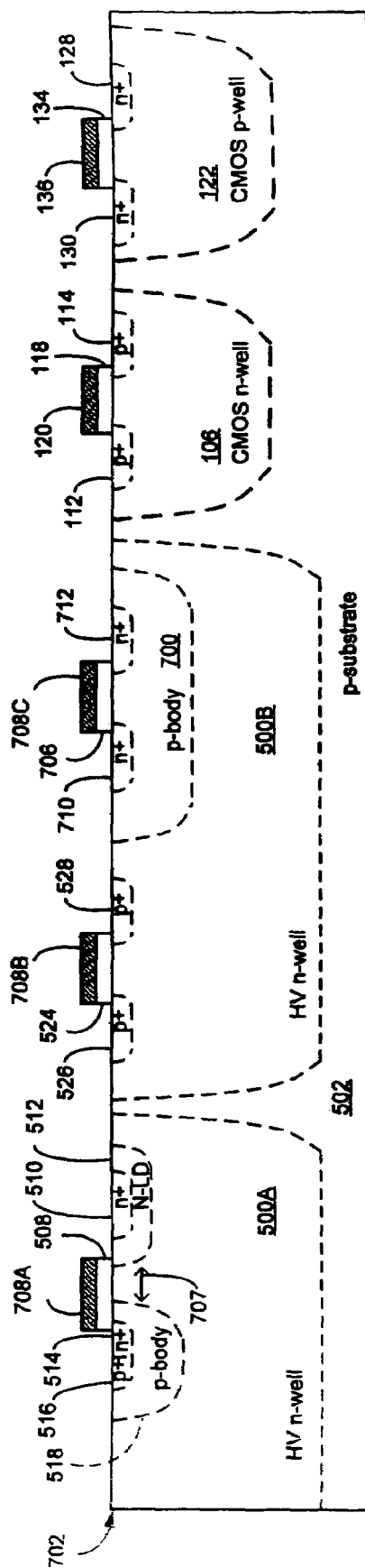

The n+ regions and p+ regions of the LDMOS transistor, the PMOS transistor with floating operation capability, and the NMOS transistor with floating operation capability, and the conventional CMOS transistors, are implanted (step 616). As shown in FIG. 7H, the p+ regions 526 and 528 are implanted at the drain and source, respectively, of the PMOS transistor with floating operation capability. A p+ region 516 is also implanted at the source of the LDMOS transistor. The LDMOS transistor also include an n+ region 510 implanted at the drain and an n+ region 514 implanted at the source. The n+ regions 710 and 712 are implanted at the drain and source, respectively, of the NMOS transistor with floating operation capability. P+ regions 112, 114, are implanted at the source and drain, respectively, of the conventional PMOS transistor. N+ regions 128, 130 are implanted at the source and drain regions, respectively, of the conventional NMOS transistor. P+ regions 526, 528, 516, 112, 114 and n+ regions 510, 514, 710, 712, 128, 130 can be formed through a 3 step process as described above in connection with a submicron CMOS process.

The process 600 provides several potential advantages. First, the P-body of the LDMOS transistor is implanted and diffused prior to formation of the gate oxide of the conventional CMOS transistors. The thermal cycle associated with the P-body implant therefore does not substantially affect the fixed thermal budget associated with sub-micron CMOS process steps (e.g., process step 206). Second, any channel length variation due to misalignment of the P-body 518 and n+ region 514 can be mitigated by a greater critical dimension (CD) control of the process 600.

Also, PMOS transistors are typically formed on a conventional CMOS n-well. In applications where a shift in threshold voltages of CMOS transistors is tolerable, a PMOS transistor can be directly implemented in an HV n-well, such as the PMOS transistor with floating operation capability in the example of FIG. 7H. Implementing a PMOS transistor directly in an HV n-well has the advantage of allowing the process 600 to skip a conventional CMOS n-well implant and masking step (while maintaining its thermal cycle), thereby potentially lowering the overall process manufacturing cost.

Figure 10B:
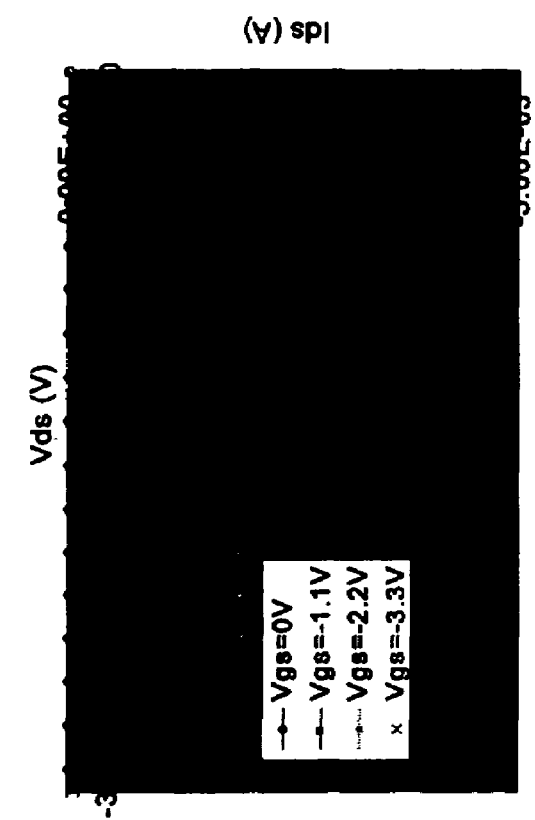
FIGS. 10A-10B shows a graph of current conductance as a function of voltage difference between the drain and source of a PMOS transistor implemented in an HV n-well and a conventional CMOS n-well, respectively.
Figure 10A:
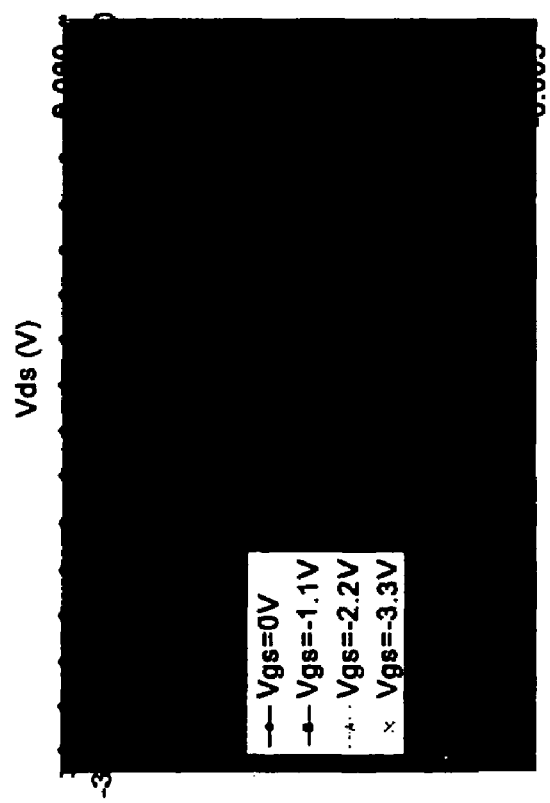

FIGS. 10A and 10B shows a graph of current conductance as a function of voltage difference between the drain and source of a PMOS transistor implemented in an HV n-well and a conventional CMOS n-well, respectively.

As a PMOS transistor can be directly implemented in the HV n-well, an NMOS transistor can similarly be implemented within a P-body implant, such as the NMOS transistor with floating operation capability in the example of FIG. 7H. A conventional sub-micron CMOS process can therefore skip a conventional CMOS P-well implant and masking step (while maintaining its thermal cycle) to lower the overall process manufacture cost.

Figure 11B:
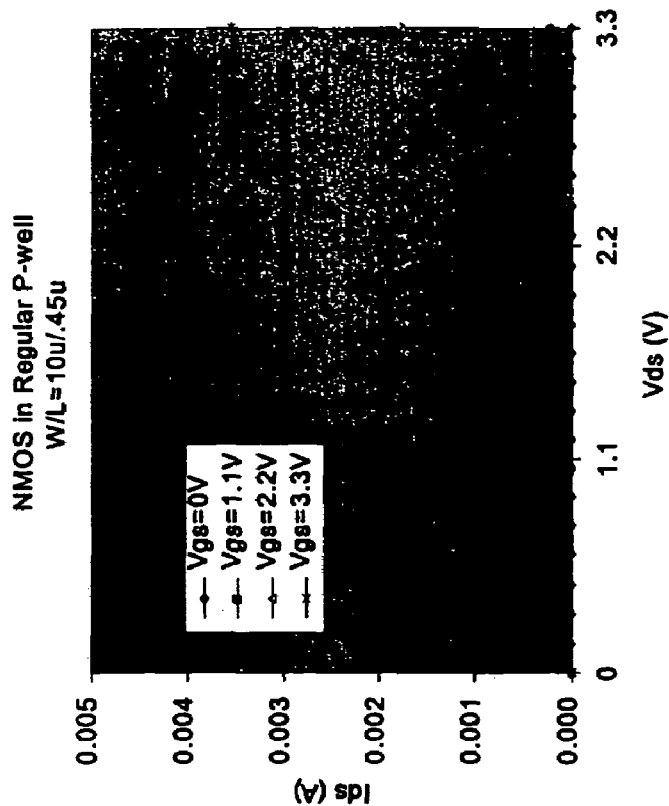
FIGS. 11A-11B shows a graph of current conductance as a function of voltage difference between the drain and source of an NMOS transistor implemented in a P-body implant and a conventional NMOS transistor implemented in a CMOS p-well, respectively.
Figure 11A:
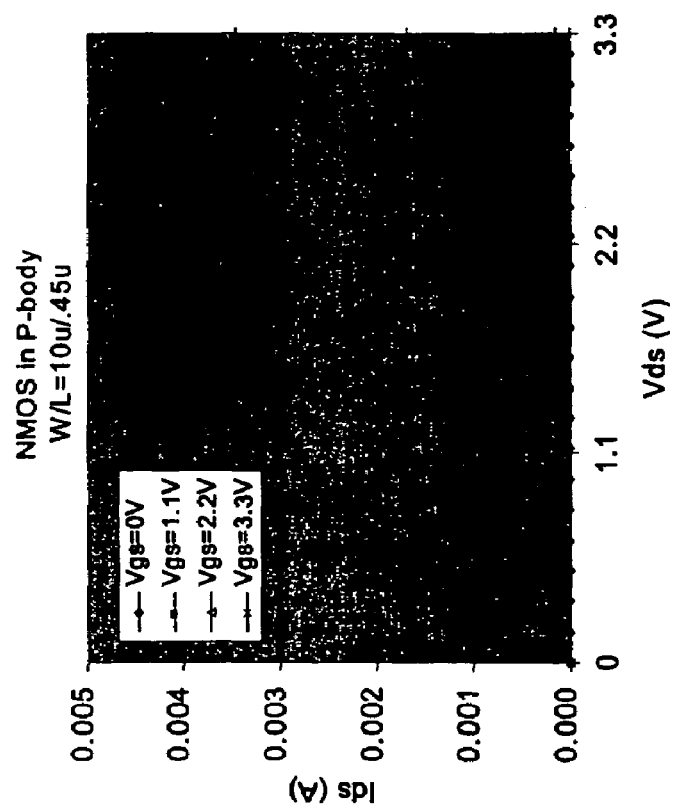

FIGS. 11A and 11B shows experimental data of a 3.3V NMOS transistor fabricated in a P-body implant and a 3.3V NMOS transistor fabricated in a conventional P-well, respectively.

Figure 12:
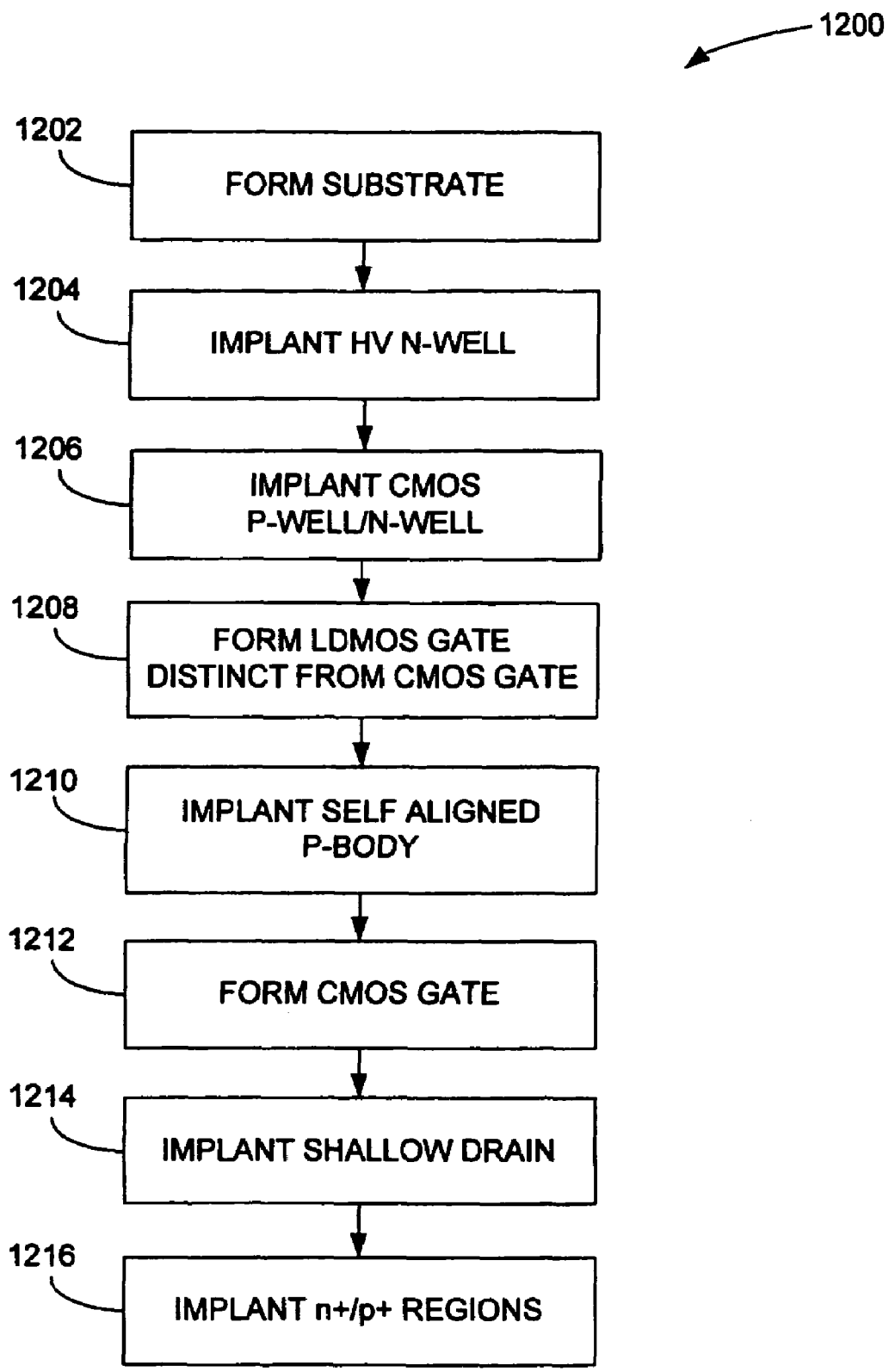
FIG. 12 is a flow diagram illustrating an alternative process for manufacturing a semiconductor transistor including an LDMOS transistor according to a process that is compatible with a sub-micron CMOS process.

FIG. 12 illustrates an alternative process 1200 of fabricating an LDMOS transistor that is compatible with a typical sub-micron CMOS process.

Figure 13A:
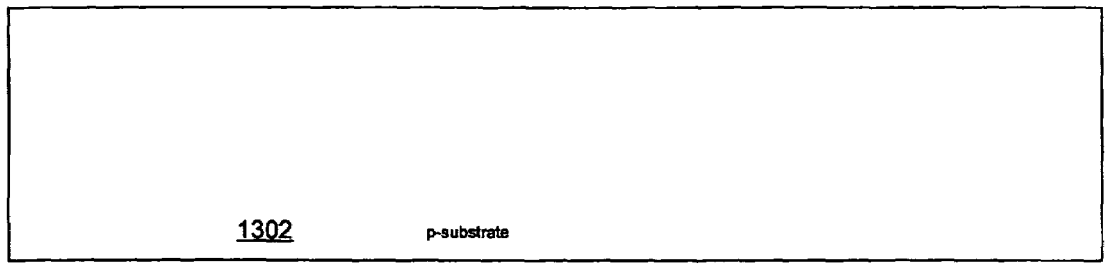
FIGS. 13A-13G illustrate the process of manufacturing an LDMOS transistor according to the process of FIG. 12.
Figure 13B:
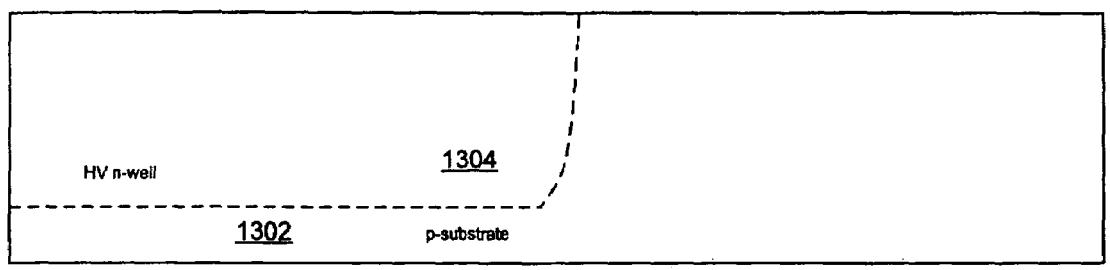
Figure 13C:
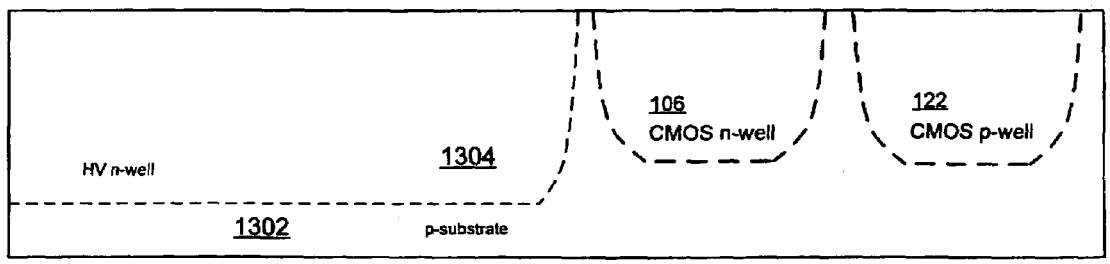
Figure 13D:
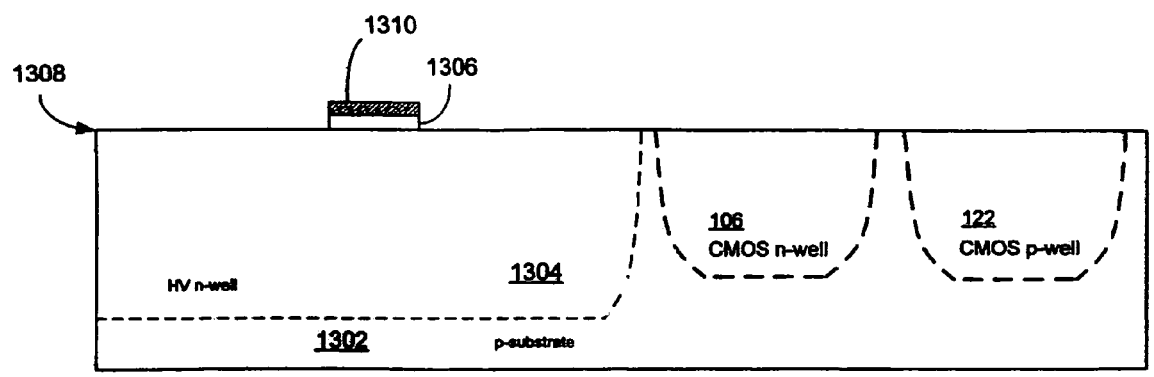

The process 1200 begins with forming a substrate (step 1202). The substrate can be a p-type substrate or an n-type substrate. Referring to the example of FIG. 13A, a semiconductor layer consisting of a p-type substrate 1302 is formed. An HV n-well for the LDMOS transistor is implanted into the substrate (step 1204). The implanted well can be an HV (high voltage) n-well, such as HV n-well 1304 (FIG. 13B). A CMOS n-well 106 for a conventional PMOS transistor and a CMOS p-well 122 for a conventional NMOS transistor are implanted into the substrate (step 1206) (FIG. 13C). An LDMOS gate oxide and polysilicon is formed for the LDMOS transistor (step 1208). The LDMOS gate oxide and polysilicon is distinct from the gate oxide and polysilicon of the conventional CMOS transistors (step 1208)—i.e., the gate of the LDMOS transistor is formed separate from and prior to the formation of the gate of the conventional CMOS transistors being fabricated at the same time. Referring to the example of FIG. 13D, the LDMOS gate oxide 1306 is formed on the surface 1308 of the substrate on the HV n-well 1304, and a polysilicon layer 1310 is deposited over the LDMOS gate oxide.

Figure 13E:
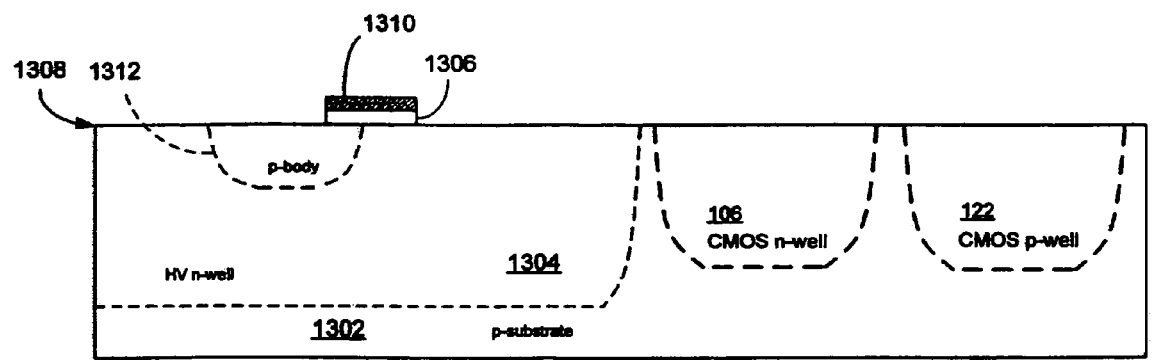

A self aligned P-body 1312 (with respect to the gate of the LDMOS transistor) for the drain region of the LDMOS transistor is implanted (step 1210). As shown in FIG. 13E, the P-body 1312 is implanted into the HV n-well 1304. The self aligned P-body 1312 can be implanted into the HV n-well in two steps, as discussed above, to allow for a better control of the vertical depth and the amount of lateral side diffusion of the P-body. The P-body drive-in and annealing process can occur prior to, for example, formation of the gate oxide of the conventional CMOS transistors such that a redesign of the thermal cycle allocated to sub-micron CMOS processes (e.g., process step 206) is not required.

Figure 13F:
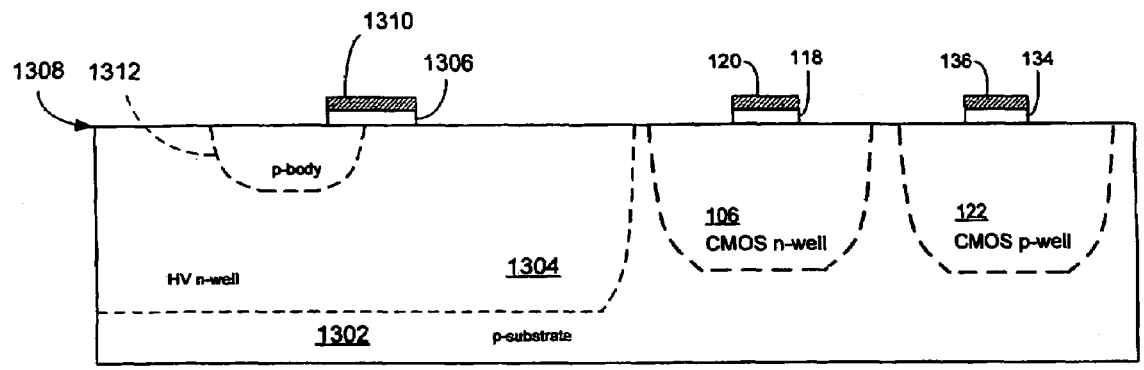
Figure 13G:
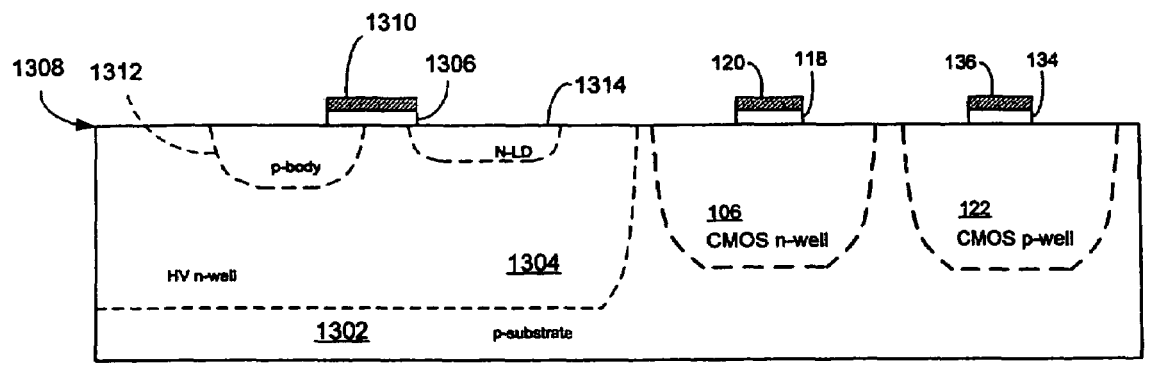
Figure 13H:
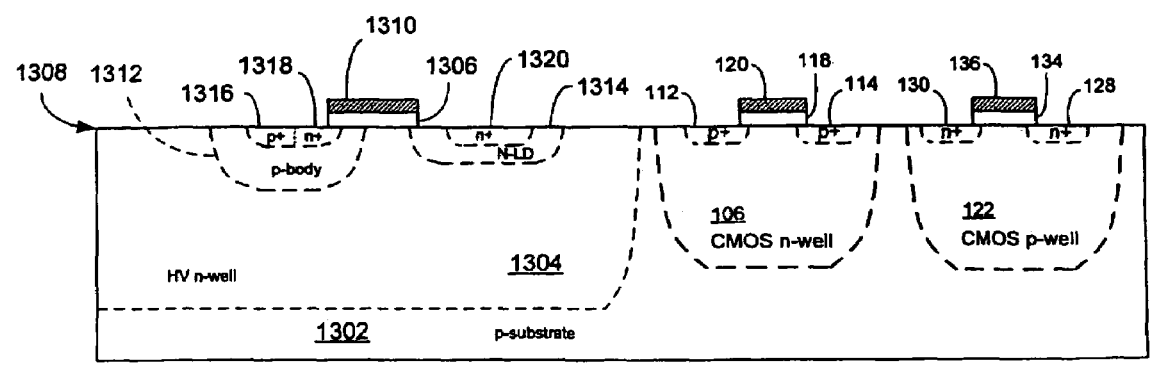

The gate of the conventional CMOS transistors is formed (step 1212). Referring to FIG. 13F, the gate oxide 118 of the conventional PMOS transistor is formed on the surface of the substrate on the CMOS n-well 106, and the gate oxide 134 of the conventional NMOS transistor is formed on the surface of the substrate on the CMOS p-well 122. A polysilicon layer 120 is deposited over the conventional PMOS gate oxide 118, and a polysilicon layer 136 is deposited over the conventional NMOS gate oxide 134. A shallow drain is implanted and diffused into the drain of the LDMOS transistor (step 1214). The shallow drain can be non-self aligned or self aligned. In the example of FIG. 13G, the shallow drain is the n-doped shallow drain N-LD 1314. The N-LD implant can share the same mask as the HV n-well to reduce the mask count. The n+ regions and p+ regions of the LDMOS transistor are implanted (step 1216). In one implementation, during this step, n+ and p+ regions associated with the CMOS transistors are also implanted. As shown in FIG. 13H, a p+ region 1416 and an n+ region 1418 are implanted at the source of the LDMOS transistor. An n+ region 1420 is also implanted at the drain of the LDMOS transistor. Further, p+ regions 112, 114, are implanted at the source and drain, respectively, of the conventional PMOS transistor, and n+ regions 128, 130 are implanted at the source and drain regions, respectively, of the conventional NMOS transistor. As in process 600, formation of the p+ regions and the n+ regions can occur through a 3 step process as described above in connection with a sub-micron CMOS process.

LDMOS Transistor Performance

The three-way performance tradeoff between the on-resistance $R_{dson}$, the drain-to-substrate breakdown voltage $BV_{d\_s}$, and the source-to-substrate punch-through breakdown voltage $BV_{s\_sub}$ of an LDMOS transistor can be improved by using a triple diffusion (N+/N-LD/HV n-well) drain structure that can be fabricated through a process compatible with a typical sub-micron CMOS process.

LDMOS transistors can be fabricated on a common HV n-well. A main design requirement of the common HV n-well is to provide an optimized vertical doping profile to achieve the highest drain-to-substrate breakdown voltage $BV_{d\_sub}$ and source-to-substrate punch-through breakdown voltage $BV_{s\_sub}$ as required among all LDMOS transistors being fabricated. For a high voltage LDMOS transistor—e.g., greater than 30V—the HV n-well is generally deeper and lighter doped than a regular (conventional) n-well for the CMOS transistor. Since the HV n-well is implanted at the beginning of the processes 600, 1200, its formation has no impact on fixed thermal budgets (that have been optimized for the mass production of sub-micron CMOS devices) allocated to sub-micron CMOS processes. An extra drive-in for the HV n-well can be accommodated if a co-drive-in with a CMOS n-well is not sufficient. Generally, a deep HV n-well with retrograded vertical doping profile offers the best drain-to-substrate breakdown voltage $BV_{d\_sub}$ and source-to-substrate punch-through breakdown voltage $BV_{s\_sub}$ performances.

The shallow self aligned diffused drain implant and diffusion (N-LD 512) has a spacing from the P-body implant that is controlled by masked gate dimensions. A main design requirement of the N-LD is to achieve an optimized lateral doping profile to achieve the best performance tradeoff between the on-resistance $R_{dson}$ and the drain-to-substrate breakdown voltage $BV_{d\_sub}$ of the LDMOS transistor. Since the N-LD is a shallow diffusion, it has little impact on the vertical doping profile of the LDMOS transistor, and therefore, has little impact on the drain-to-substrate breakdown voltage $BV_{d\_sub}$ and source-to-substrate breakdown voltage $BV_{s\_sub}$ characteristics of the transistor. The spacing of the N-LD implant from the P-body allows for a better control of the drain-to-substrate breakdown voltage $BV_{d\_sub}$ by lowering the doping levels at the boundary of the HV n-well/P-body junction. Moreover, such a spacing results in improved hot carrier injection (HCI) stability of the LDMOS transistor. Generally, a graded lateral doping profile in the drain region of the LDMOS transistor (e.g., as shown in FIGS. 7H and 9) offers a better performance tradeoff between the on-resistance $R_{dson}$ and the drain-to-substrate breakdown voltage $BV_{d\_sub}$ than a uniform lateral doping profile. A graded lateral doping profile can be achieved by using a large-angel tilt (LAT) N-LD implant. Furthermore, since a deep drive-in is not required for the N-LD implant, the N-LD can be self aligned to the gate—i.e., implanted after formation of the LDMOS gate, including gates of the CMOS transistors. Therefore, the addition of the N-LD implant has substantially no impact on fixed thermal budgets associated with CMOS process steps (e.g., process step 206).

The above description describes LDMOS transistors having varied drain-to-substrate breakdown voltage $BV_{d\_sub}$ ratings that can be fabricated in processes compatible with a typical sub-micron CMOS process.

The following description describes alternative examples of LDMOS transistors that can be fabricated through processes, such as processes 600, 1200, that are compatible with a sub-micron CMOS process.

CMOS n-well as HV n-well

An interesting feature of conventional low voltage CMOS transistors—e.g., 3.3V to 5V—fabricated within a sub-micron CMOS process is that the sub-micron CMOS process typically includes implanting a CMOS n-well having a breakdown voltage around 30V. For LDMOS transistors designed for applications of a medium voltage range (e.g., 5V to 25V), these LDMOS transistors can be fabricated on a regular CMOS n-well, thus eliminating a separate HV n-well implant and masking step—i.e., steps 604, 1204 of processes 600, 1200, respectively. The remaining steps of processes 600, 1200 can be unaltered.

Figure 14:
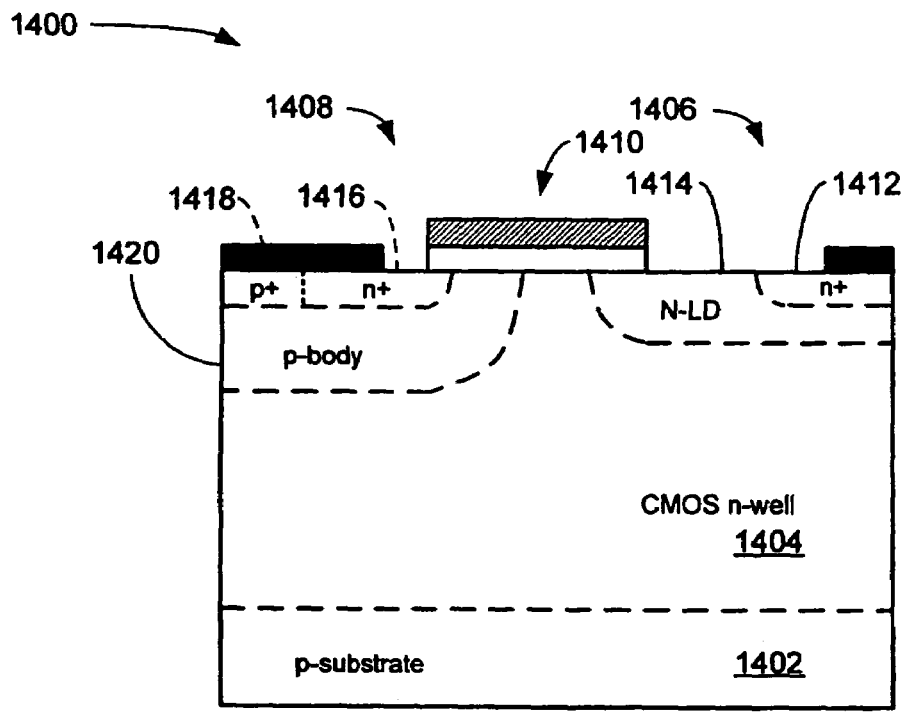
FIG. 14 is a schematic cross-sectional view of an LDMOS transistor having a CMOS n-well implant.

FIG. 14 shows an example LDMOS transistor 1400 fabricated on a p-type substrate 1402 having a CMOS n-well implant 1404 for the LDMOS transistor. The LDMOS transistor 1400 includes a drain region 1406, a source region 1408, and a gate 1410. The drain region 1406 includes an n-doped n+ region 1412 and an n-doped shallow drain (N-LD) 1414. The source region 1408 includes an n-doped n+ region 1416, a p-doped p+ region 1418, and a p-doped P-body 1420.

CMOS n-well as N-LD

For LDMOS transistors designed for application in a high voltage range, the HV n-well will typically be much deeper than the regular CMOS n-well. It is therefore possible to substitute the CMOS n-well for the N-LD, thus eliminating the N-LD implant and masking step—i.e., steps 614, 1214 of processes 600, 1200, respectively. Therefore, in processes 600, 1200 above, a CMOS n-well can be implanted before the gate of the LDMOS transistor is formed, and the CMOS n-well can serve as the shallow drain and would be non-self aligned with respect to the gate. The remaining steps of processes 600, 1200 can be unaltered.

Figure 15:
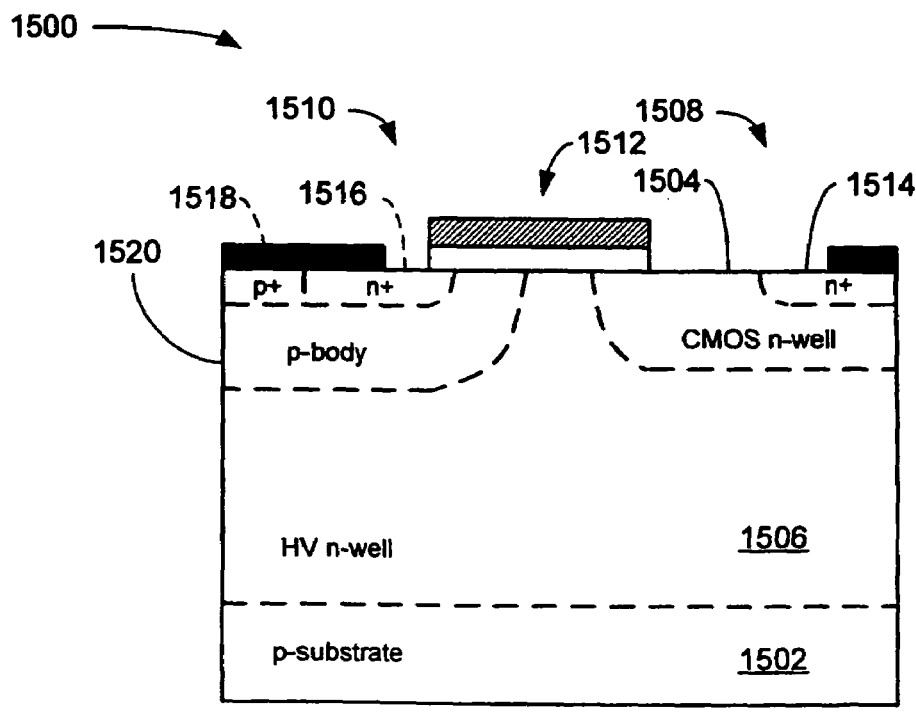
FIG. 15 is a schematic cross-sectional view of an LDMOS transistor having a CMOS n-well implant as a shallow drain.

FIG. 15 shows an example LDMOS transistor 1500 fabricated on a p-type substrate 1502 having a CMOS n-well 1504 as the shallow drain. The LDMOS transistor 1500 has an HV n-well implant 1506 for the transistor. The LDMOS transistor 1500 includes a drain region 1508, a source region 1510, and a gate 1512. The drain region 1508 includes an n-doped n+ region 1514 and an n-doped shallow drain (CMOS n-well) 1504. The source region 1510 includes an n-doped n+ region 1516, a p-doped p+ region 1518, and a p-doped P-body 1520.

DDD as N-LD

In applications where the sub-micron CMOS process includes fabrication of a DDD (Double Doped Drain) HV-CMOS transistor module, the same DDD implant can be implemented as the shallow drain of the LDMOS transistor to modulate the resistance of the drain, thus eliminating the N-LD implant and masking steps 614, 1214 described above. The remaining steps of processes 600, 1200 can be unaltered. The DDD implant can be self aligned or non-self aligned with respect to the LDMOS gate. In addition, the DDD implant can have an offset from the P-body implant such that the DDD implant extends a predetermined distance d from the LDMOS gate.

Figure 16:
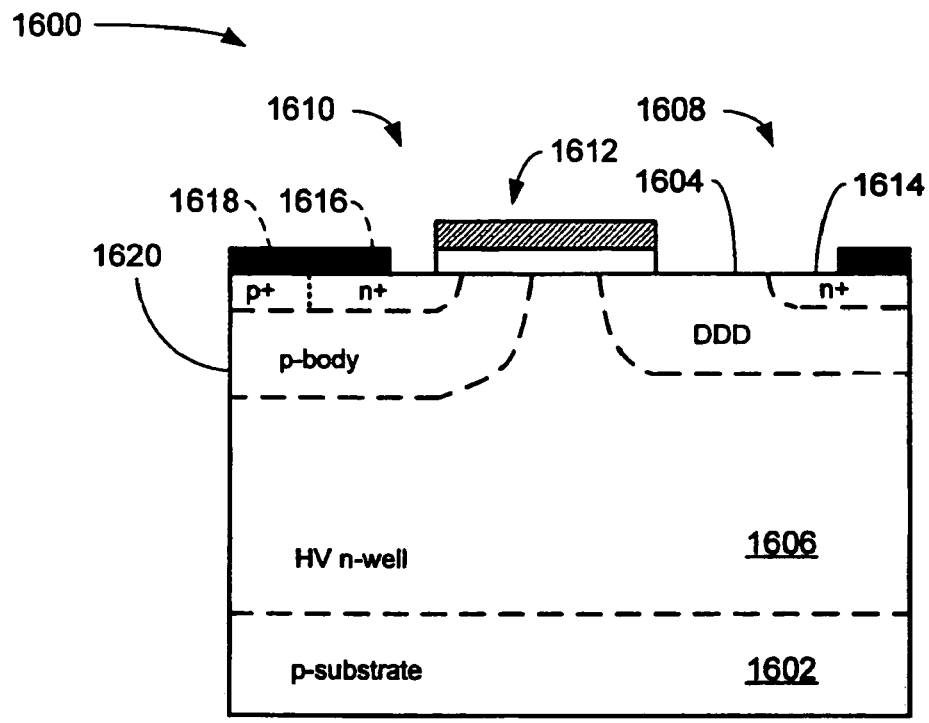
FIG. 16 is a schematic cross-sectional view of an LDMOS transistor having a DDD implant as a shallow drain.

FIG. 16 shows an example LDMOS transistor 1600 fabricated on a p-type substrate 1602 having a DDD implant 1604 as the shallow drain. The LDMOS transistor 1600 has a CMOS n-well implant 1606 for the transistor. The LDMOS transistor 1600 includes a drain region 1608, a source region 1610, and a gate 1612. The drain region 1608 includes an n-doped n+ region 1614 and an n-doped shallow drain (CMOS n-well) 1604. The source region 1610 includes an n-doped n+ region 1616, a p-doped p+ region 1618, and a p-doped P-body 1620.

LDD as N-LD

In a conventional sub-micron CMOS process, a LDD (Lightly Doped Drain) implant and spacer formation step can be introduced to improve NMOS transistor ruggedness against hot electron degradation. In one implementation, the LDD implant can be used as the shallow drain for the LDMOS transistor, thus eliminating the N-LD implant and masking steps 614, 1214 of processes 600, 1200, respectively. The remaining steps of processes 600, 1200 can be unaltered.

Figure 17:
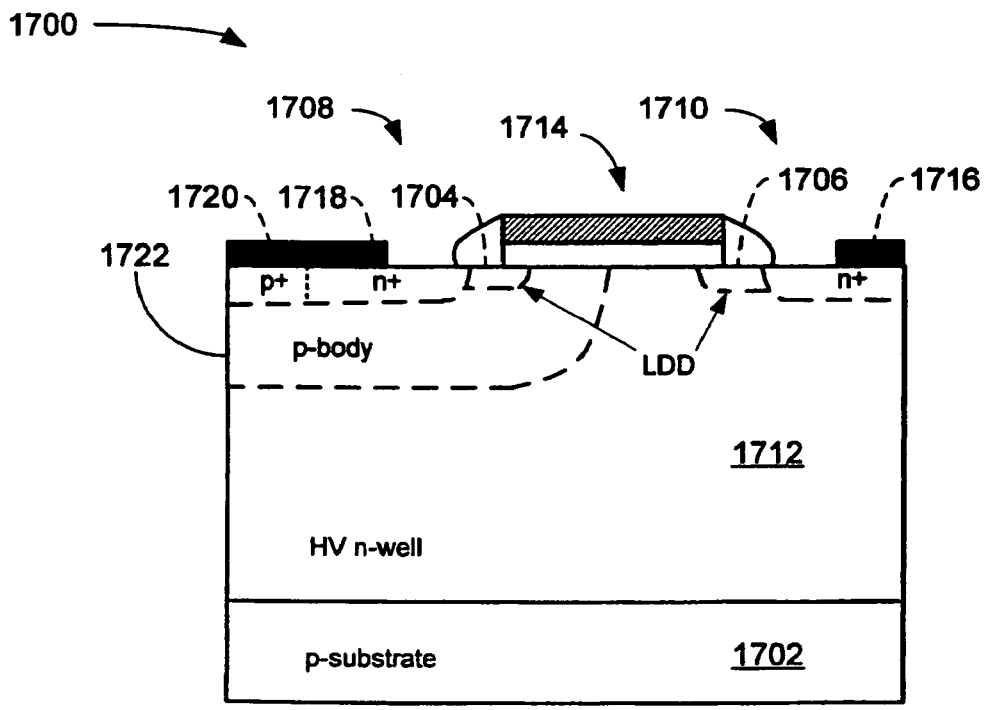
FIG. 17 is a schematic cross-sectional view of an LDMOS transistor having an LDD diffused into source and drains regions of the transistor.

FIG. 17 shows an example of an LDMOS transistor 1700 fabricated on a p-type substrate 1702 having an LDD 1704, 1706 diffused into the source region 1708 and drain region 1710, respectively of the LDMOS transistor. The LDMOS transistor 1700 has an HV n-well implant 1712 for the LDMOS transistor. The LDMOS transistor also includes a gate 1714. The drain region 1710 further includes an n-doped n+ region 1716. The source region 1708 also includes an n-doped n+ region 1718, a p-doped p+ region 1720, and a p-doped P-body 1722.

N-LD Implant Defined by N+ Slit Mask

In one implementation, a graded shallow drain surface implant is achieved by utilizing a slit mask to create multiple standard n+ implants spaced apart relative to each other along the surface of the LDMOS transistor in the drain region, thus eliminating the N-LD implant and masking step—i.e., steps 614, 1214 described above. The multiple n+ implants in the drain region results in an overall lower doping through dopant-side diffusion. This implementation is particularly suited for LDMOS transistors with a high breakdown voltage specification. The remaining steps of processes 600, 1200 can be unaltered.

Figure 18:
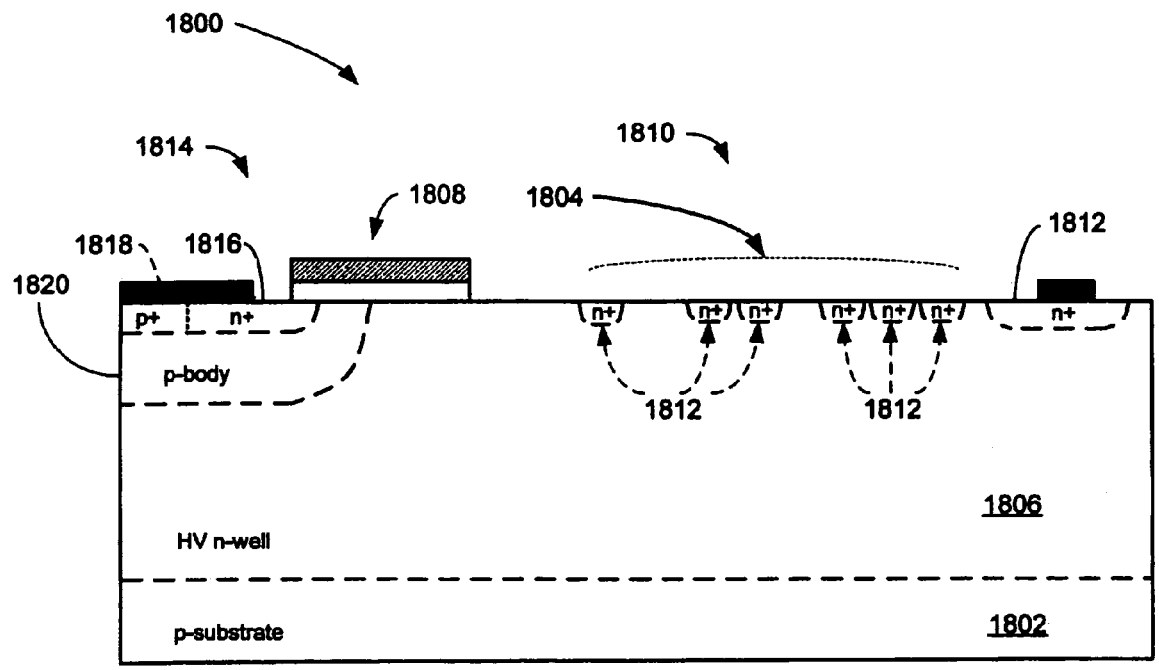
FIG. 18 is a schematic cross-sectional view of an LDMOS transistor having a graded shallow drain implant.

FIG. 18 illustrates an example of an LDMOS transistor 1800 fabricated on a p-type substrate 1802 having a graded shallow drain surface implant 1804. The LDMOS transistor 1800 has an HV n-well implant 1806 for the transistor. The LDMOS transistor also includes a gate 1808. The drain region 1810 further includes n-doped n+ regions 1812. The source region 1814 includes an n-doped n+ region 1816, a p-doped p+ region 1818, and a p-doped P-body 1820.

p-type LDMOS Transistor

Figure 19:
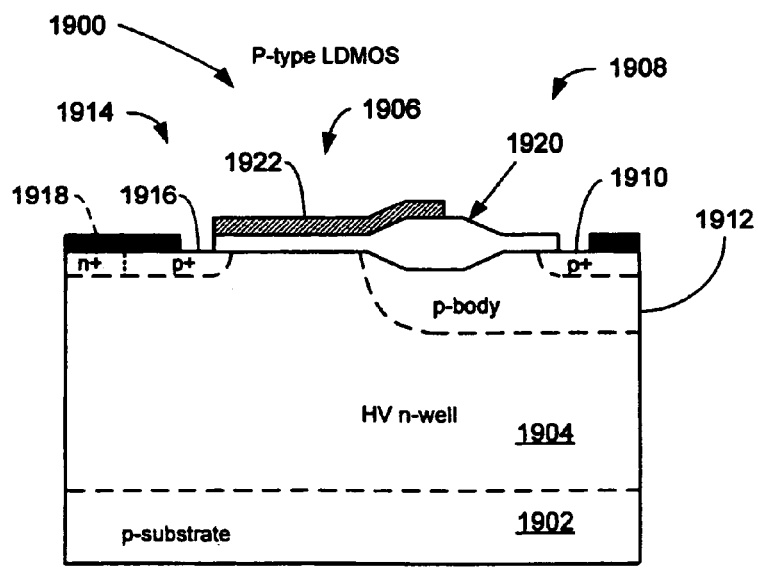
FIG. 19 is a schematic cross-sectional view of a p-type LDMOS transistor.

A p-type high voltage LDMOS transistor can be fabricated. FIG. 19 shows an example a p-type LDMOS transistor 1900 fabricated on a p-type substrate 1902. The LDMOS transistor 1900 has an HV n-well implant 1904 for the transistor. The LDMOS transistor also includes a gate 1906. The drain region 1908 include a p-doped p+ region 1910 and a p-doped P-body 1912. The source region 1914 includes a p-doped p+ region 1916, and an n-doped n+ region 1918.

Figure 20:
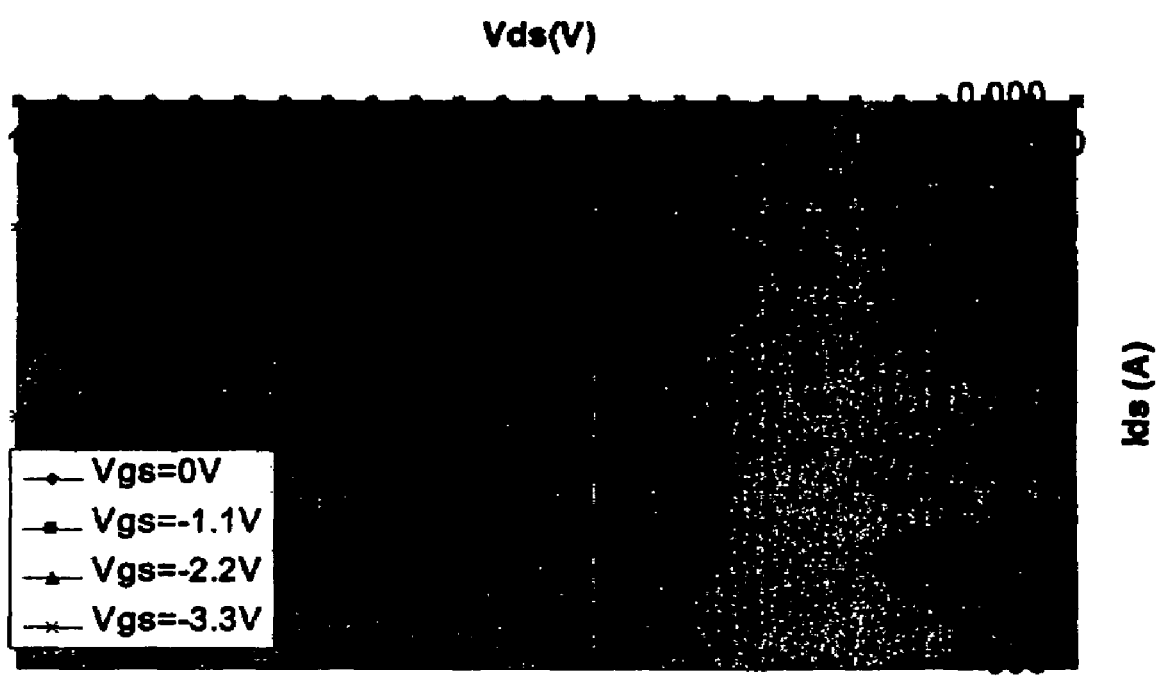
FIG. 20 shows a graph of current conductance as a function of voltage difference between the drain and source of a p-type LDMOS transistor.

FIG. 20 shows experimental data of such a p-type LDMOS transistor. As with the LDMOS transistor illustrated in FIG. 5A, the p-type LDMOS transistor 1900 is fabricated with a non-self aligned P-body implant 1912. More generally, a common feature of the LDMOS transistors illustrated in FIGS. 14-19 is that the P-body implant is formed prior to gate formation of conventional CMOS transistors. This ensures that the LDMOS transistors can be fabricated in a process that is compatible with a sub-micron CMOS process having fixed parameters that have been optimized for the mass production of sub-micron CMOS devices.

The availability of complementary p-type LDMOS transistor simplifies the design of level shift circuits. The p-type LDMOS transistor, as with each of the LDMOS transistors described above, can be implemented with either a thick or thin gate oxide. Referring again to FIG. 19, the p-type LDMOS transistor 1900 is implemented with a thick gate oxide 1920. For example, when an LDMOS transistor, such as LDMOS transistor 416 (FIG. 5A) is implemented with a high voltage gate—i.e., a gate with a thick gate oxide—a standard high-side p-type transistor (e.g., a PMOS transistor) can be implemented within a switching regulator circuit, thus obviating a need for high-side gate drive considerations. Such an approach results in a hybrid switching regulator, with a low-side LDMOS transistor and a high-side PMOS transistor that minimizes dynamic capacitive losses associated with a high-side PMOS pull-up transistor, as illustrated in the switching regulator 400 of FIG. 4. The low-side LDMOS transistor can have an optimized on-resistance $R_{dson}$ (thin or thick gate oxide). The high-side PMOS transistor can be designed such that dynamic capacitive losses typically associated with high-side PMOS pull-up transistors is minimized. In typical DC-DC conversion applications, in which the conduction duty of the high-side switch is relatively low, the on-resistance $R_{dson}$ of the high-side transistor is a secondary consideration.

Figure 21:
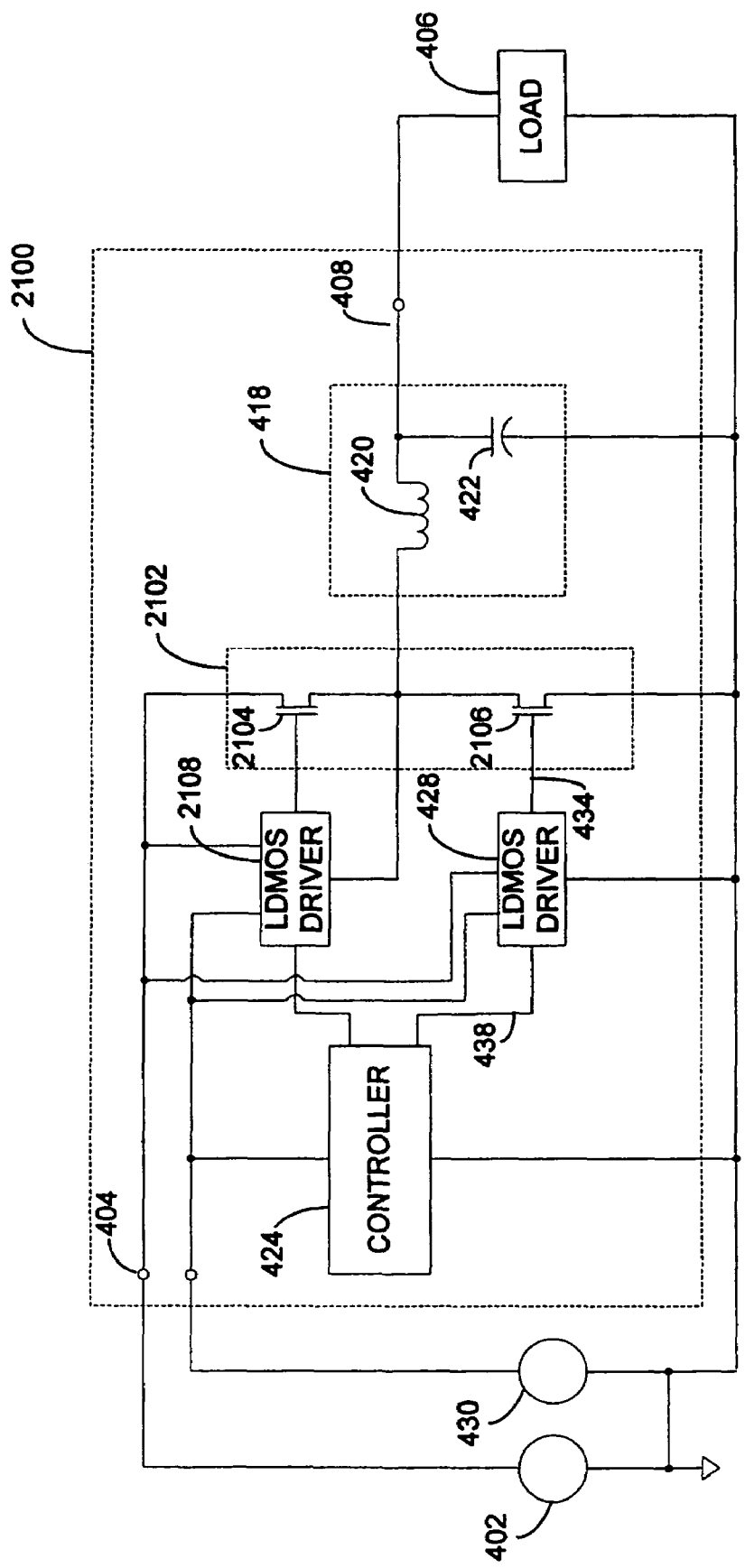
FIG. 21 is a schematic cross-sectional view of a switching circuit including a switching circuit having a high-side LDMOS transistor and a low-side LDMOS transistor.

FIG. 21 illustrates a non-hybrid switching regulator 2100 having a switching circuit 2102 that includes a high-side LDMOS transistor 2104 and a low-side LDMOS transistor 2106. The LDMOS transistors 2104, 2106 can be fabricated through process 600 or 1200. The switching regulator 2100 operates in similar fashion to the switching regulator 400 (FIG. 4). However, the switching regulator 2100 includes an LDMOS driver 2108 to drive the high-side LDMOS transistor 2104. Generally, the LDMOS driver 2108 cannot be fabricated using conventional CMOS transistors. However, using through processes 600, 1200, the LDMOS driver 2108 can be fabricated using PMOS transistors with floating operation capability and NMOS transistors with floating operation capability. LDMOS driver 428 can be fabricated using conventional CMOS transistors, or using PMOS transistors with floating operation capability and NMOS transistors with floating operation capability. Controller 424 is typically fabricated using conventional CMOS transistors.

Other Device Structures

NPN Transistor

Figure 22:
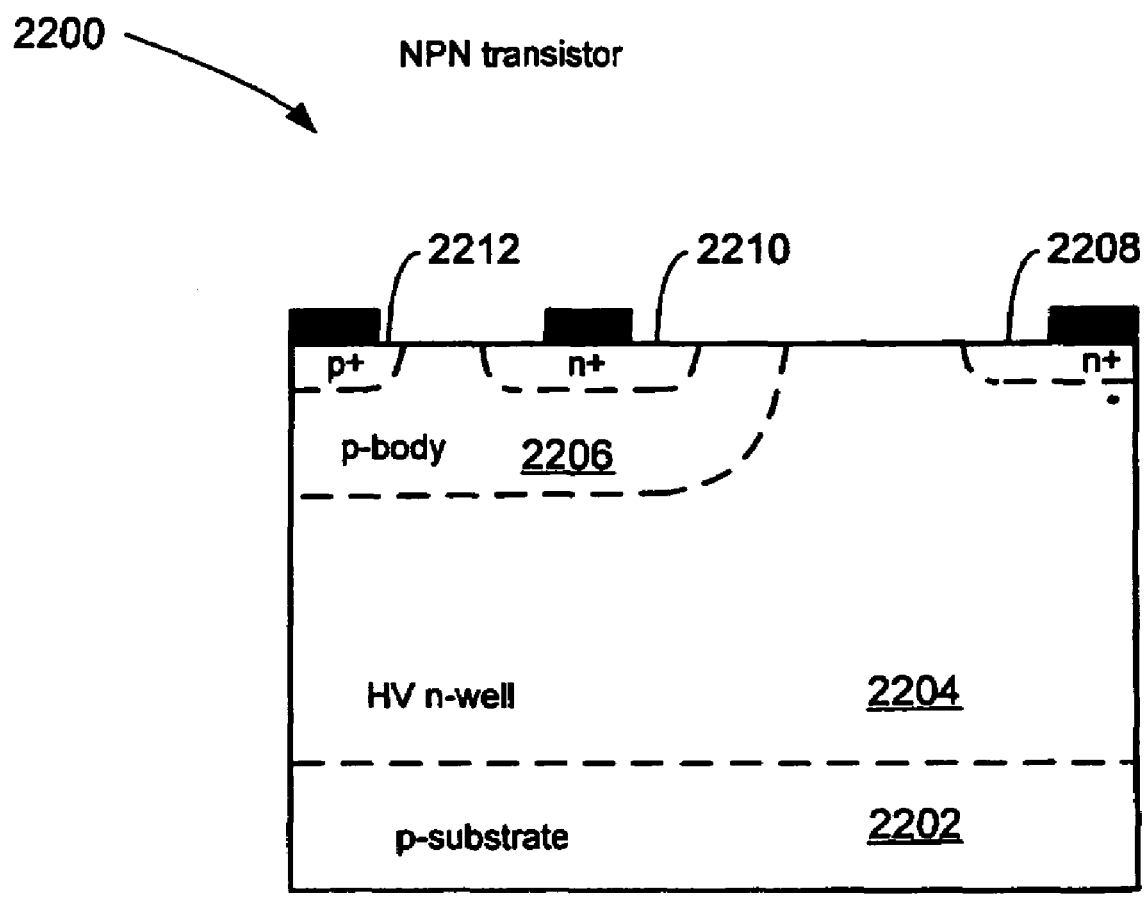
FIG. 22 is a schematic cross-sectional view of a NPN transistor.

Generally, only PNP transistors can be fabricated in a typical sub-micron CMOS process. However, process 600 can be modified to allow fabrication of an NPN transistor. FIG. 22 shows a cross-sectional view of an example NPN transistor 2200 that can be fabricated through a process compatible with a sub-micron CMOS process.

Figure 23:
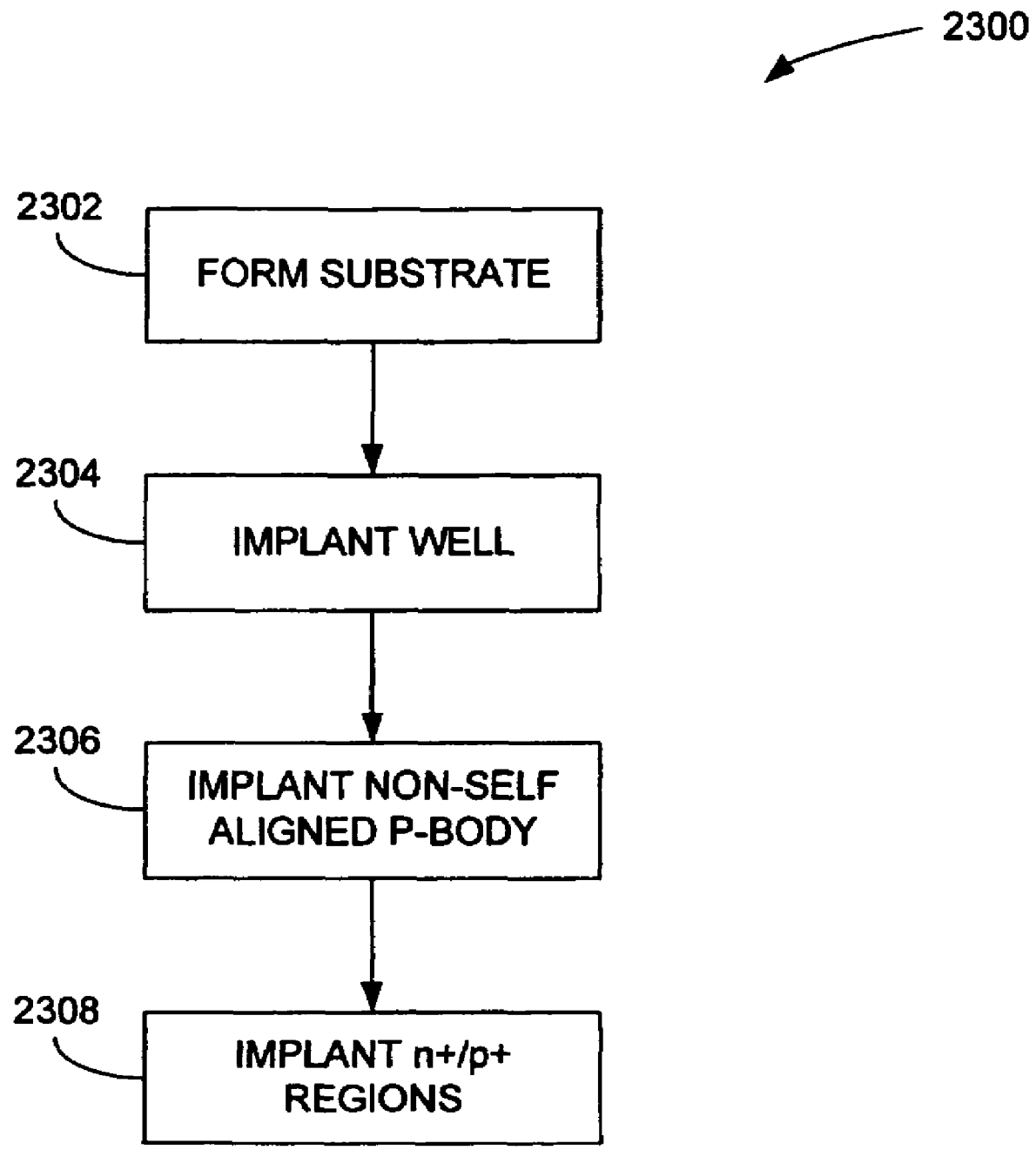
FIG. 23 is a flow diagram illustrating a process for manufacturing the NPN transistor of FIG. 22.

FIG. 23 illustrates a process 2300 for fabricating an PNP transistor, such as PNP transistor 2200. The process 2300 begins with forming a substrate (step 2302), such as p-type substrate 2202 (FIG. 22). A well for the NPN transistor is implanted into the substrate (step 2304). The implanted well can be an HV (high voltage) n-well 2204, as shown in the example of FIG. 22. A non-self aligned P-body is implanted into the surface of the transistor (step 2306), which is illustrated as P-body 2206 in FIG. 22. The n+ regions and p+ regions of the PNP transistor are implanted (step 2308), such as n+ regions 2208 and 2210, and p+ region 2212 (FIG. 22).

Figure 24:
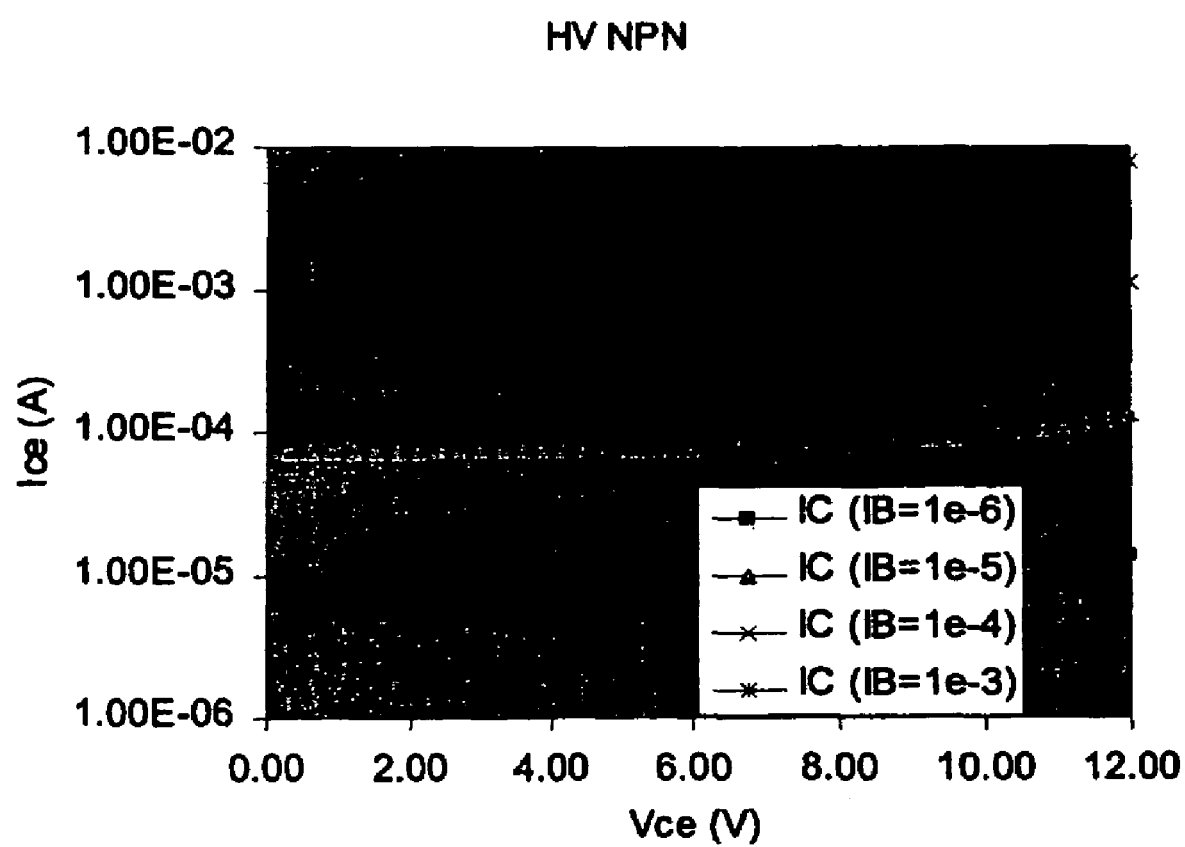
FIG. 24 shows a graph of current conductance as a function of voltage of the NPN transistor of FIG. 22.

FIG. 24 shows experimental I-V characteristics of such a PNP transistor. The availability of complementary NPN and PNP transistors enhances high performance analog circuit design.

CMOS Transistors with Floating Operation Capability

Figure 25A:
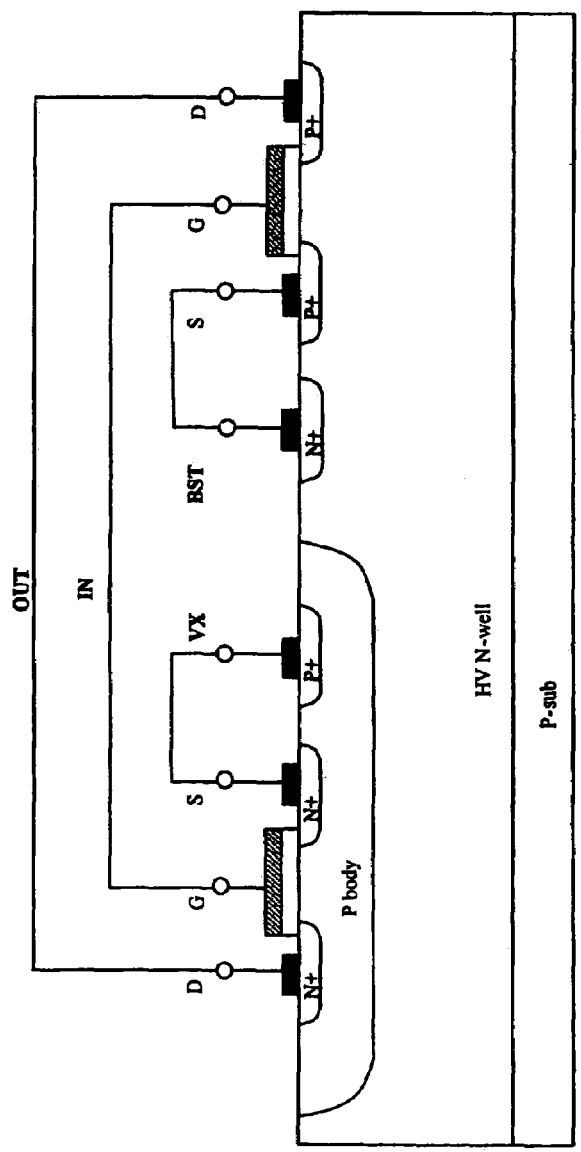
FIGS. 25A and 25B are a schematic cross-sectional view of an implementation of high-side drive (HSD) circuits with CMOS logic and a circuit diagram of the HSD circuits with CMOS logic, respectively.
Figure 25B:
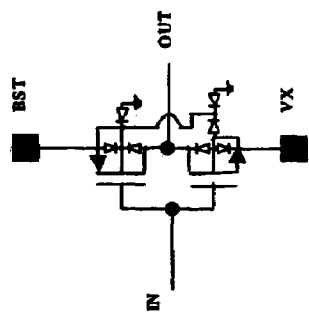

An NMOS transistor with floating operation capability (i.e., the source of the NMOS transistor is not grounded) can be implemented through processes 600, 1200, as described above. Such an NMOS transistor, together with a PMOS transistor fabricated in an HV n-well, allows for the implementation of high-side drive (HSD) circuits (e.g., LDMOS driver 2208) with CMOS transistor logic as shown in FIGS. 25A and 25B.

Figures 26A, 26B:
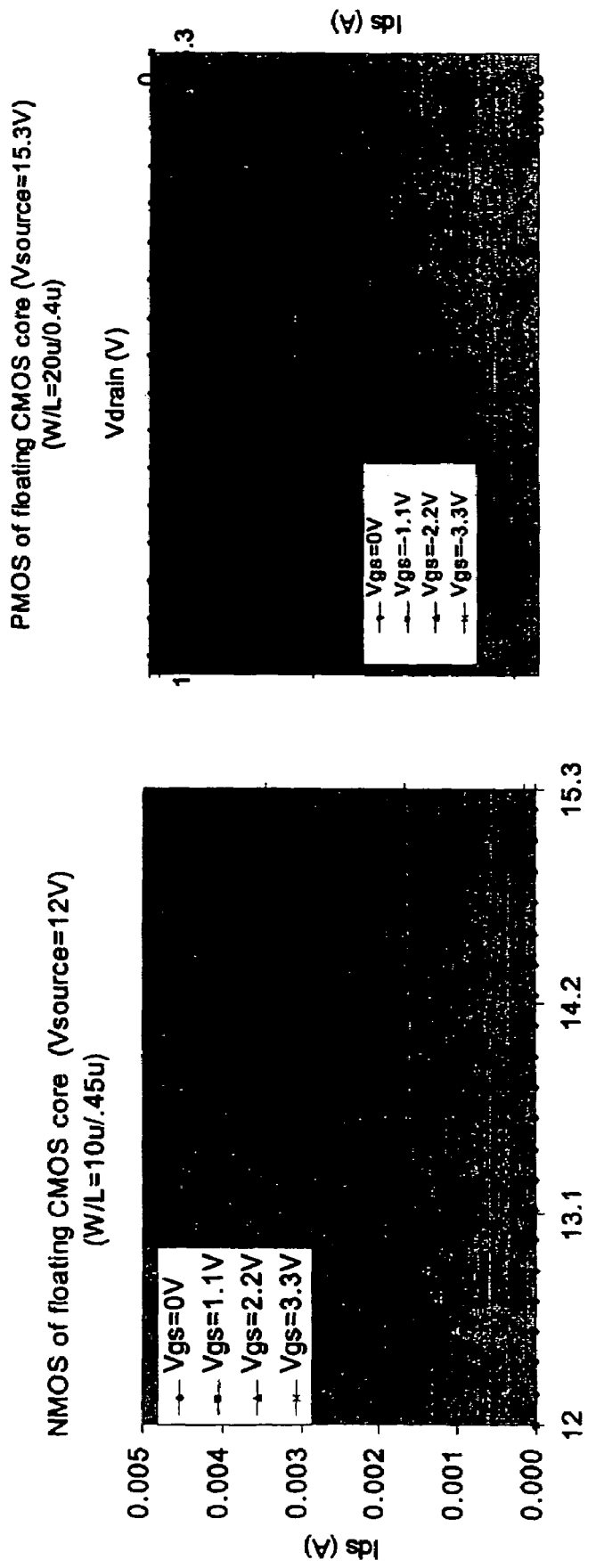
FIGS. 26A and 26B show a graph of conductance of the CMOS transistors of FIGS. 25A and 25B.

FIGS. 26A and 26B show experimental data of such CMOS transistors with floating operation capability.

Figure 27:
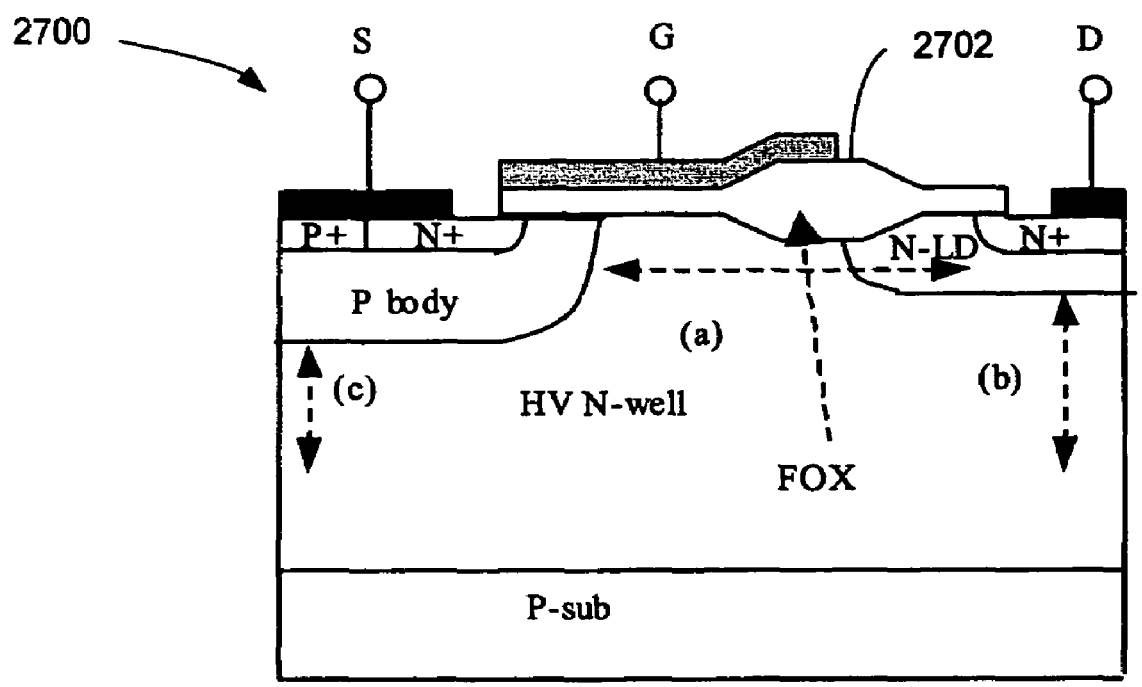
FIG. 27 is a schematic cross-sectional view of a LDMOS transistor with LOCOS on the drain region of the transistor.

A number of embodiments of the invention have been described. Nevertheless, it will be understood that various modifications may be made without departing from the spirit and scope of the invention. For example, although some of the LDMOS transistor structures described above do not have LOCOS field oxide (FOX) 2702 on the drain region of the devices. The processes described above also apply to LDMOS transistor structures with LOCOS on the drain region of the devices such as LDMOS transistor 2700 shown in FIG. 27. The devices described above can be implemented in general half-bridge or full-bridge circuits, and also in other power electronics systems.

Figure 28:
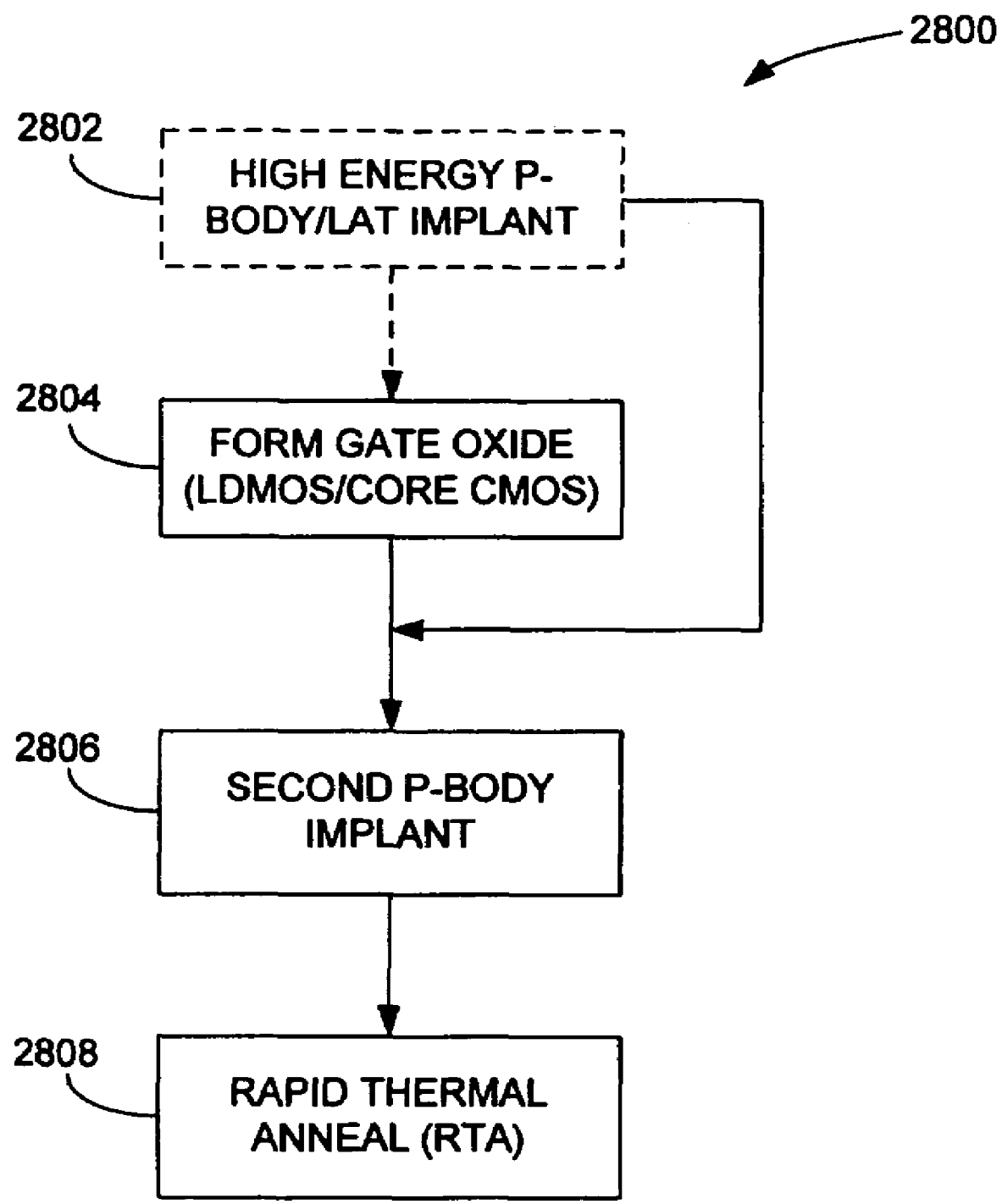
FIG. 28 is a flow diagram illustrating a process for implanting a P-body of an LDMOS transistor.

A common feature of the LDMOS transistors described above is that the P-body implant is formed prior to gate oxide formation of conventional CMOS transistors to ensure that the LDMOS transistors can be fabricated in a process that is compatible with a sub-micron CMOS process. As discussed above, in one implementation, the P-body can implanted in two steps using a first high energy implant and a second implant, followed by a RTA process. The first high energy implant can be implanted using a LAT implant. FIG. 28 shows a process 2800 for implanting the P-body without substantially disturbing the CMOS process thermal cycle. The second implant (step 2806), or both the high energy implant (step 2802) and second implant, can occur after gate oxide formation of CMOS transistors (step 2804). The second implant is followed by a RTA process (step 2808). The RTA process is implemented with a short duration of time and at temperatures such that thermal cycles allocated to fabricating sub-micron CMOS transistors are substantially unaffected. As discussed above, an LDMOS transistor can be fabricated on an n-type substrate. In such an implementation, an SOI (silicon-on-insulator) insulation layer can be deposited (or grown) on the n-type substrate. A p-well for the LDMOS transistor and CMOS transistors can then be implanted. The process steps following formation of the substrate in processes 600, 1200 can then occur.

Accordingly, other implementations are within the scope of the following claims.

What is claimed is:

1. A method of fabricating a transistor having a source region, a drain region and a gate region on a substrate, the method comprising:
    implanting, into a surface of the substrate, a high voltage (HV) n-doped n-well with a first volume and a first surface area;
    forming a gate oxide between a source region and a drain region of the transistor;
    implanting, into the source region of the transistor, a p-doped p-body with a second volume and a second surface area after forming the gate oxide;
    covering the gate oxide with a conductive material;
    forming a source-side oxide spacer and a drain-side oxide spacer on sidewalls of the gate oxide;
    implanting, into the source region of the transistor, a n-doped n+ region with a third volume and a third surface area and a p-doped p+ region with a fourth volume and a fourth surface area;
    implanting, into the drain region of the transistor, a n-doped n+ region with a fifth volume and a fifth surface area; and
    implanting, into the drain region of the transistor, a n-doped lightly doped drain that is shallower than the n-doped n+ region and having a portion which extends beneath the drain-side oxide spacer, the n-doped lightly doped drain having a sixth volume and a sixth surface area.

2. The method of claim 1, wherein implanting the p-doped p-body includes:
    a first implant to limit a vertical depth of the p-doped p-body; and
    a second implant separate from the first implant to control a lateral channel length of the transistor.

3. The method of claim 2, wherein the first implant is a high energy implant.

4. The method of claim 2, wherein the first implant is a large angle tilt implant.

5. The method of claim 2, wherein the first implant is deeper than the second implant.

6. The method of claim 2, wherein the first implant to limit the vertical depth of the p-doped p-body and the second implant to control the lateral channel length of the transistor both occur after formation of the gate oxide.

7. The method of claim 1, wherein the HV n-doped n-well and the n-doped lightly doped drain have a lower concentration of impurities than the n-doped n+ region and the p-doped p+ region of the source.

8. The method of claim 1, wherein the second surface area is located within the first surface area, and the third surface area and the fourth surface area are located within the second surface area.

9. The method of claim 1, wherein the n-doped lightly doped drain is self aligned to the gate region of the transistor and is implanted after forming the gate oxide of the transistor.

10. The method of claim 1, wherein the n-doped lightly doped drain is non-self aligned to the gate region of the transistor and is implanted prior to forming the gate oxide of the transistor.

11. The method of claim 1, wherein the n-doped lightly doped drain is implanted prior to implanting the n-doped n+ region and the p-doped p+ region of the source and the n-doped n+ region of the drain.

12. The method of claim 1, wherein the substrate is a n-type substrate.

13. The method of claim 12, further comprising depositing a silicon-on-insulator on the n-type substrate.

14. The method of claim 1, further comprising implanting LOCOS field oxide in the drain region adjacent to the gate oxide.

15. The method of claim 1, wherein the spacing of the p-doped p-body from the n-doped lightly doped drain is sized such that the n-doped lightly doped drain is spaced a distance (d) away from the gate of the transistor as measured along a surface of the transistor.

16. The method of claim 1, further comprising implanting, into the source region of the transistor a lightly-doped double diffusion region with a seventh volume having a seventh surface area.

17. The method of claim 1, further comprising:
forming a field oxide on the drain region of the transistor.

18. The method of claim 1, wherein the n-doped lightly doped drain is implanted with a spacing from the p-doped p-body.

19. The method of claim 1, wherein the n-doped n+ region in the drain region is self-aligned to the gate region of the transistor, and is implanted after formation of the gate oxide.

20. The method of claim 1, wherein the portion of the n-doped lightly doped drain further extends beneath a portion of the gate oxide.

21. A method of fabricating a semiconductor device comprising:
forming a first transistor including:
implanting, into a first surface of the substrate, a first impurity region with a first volume and a first surface area, the first impurity region being of a first type;
forming a first gate oxide between a source region and a drain region of the first transistor prior to implanting a second impurity region;
implanting, into the source region of the first transistor, the second impurity region with a second volume and a second surface area after forming the first gate oxide, the second impurity region being of an opposite second type relative to the first type;
covering the first gate oxide with a first conductive material;
forming a source-side oxide spacer and a drain-side oxide spacer on sidewalls of the first gate oxide;
implanting, into the source region of the transistor, a third impurity region with a third volume and a third surface area and a fourth impurity region with a fourth volume and a fourth surface area, the third impurity region being of the first type, the fourth impurity region being of the opposite second type;
implanting, into the drain region of the first transistor, a fifth impurity region with a fifth volume and a fifth surface area, the fifth impurity region being of the first type; and
implanting, into the drain region of the first transistor, a sixth impurity region with a sixth volume that is shallower than the fifth volume and a sixth surface area, the sixth impurity region being implanted with a spacing from the second impurity region and having a portion which extends beneath the drain-side oxide spacer, the sixth impurity region being of the first type.

22. The method of claim 21, further comprising:
forming a second transistor including:
implanting, into a second surface of the substrate, a seventh impurity region with a seventh volume and a seventh surface area, the seventh impurity region being of the first type;
forming a second gate oxide between a source region and a drain region of the second transistor;
covering the second gate oxide with a second conductive material;
implanting, into the source region of the second transistor, an eighth impurity region with an eighth volume and an eighth surface area, the eighth impurity region being of the opposite second type; and
implanting, into the drain region of the second transistor, a ninth impurity region with a ninth volume and a ninth surface area, the ninth impurity region being of the opposite second type.

23. The method of claim 22, further comprising:
forming a third transistor including:
implanting, into a third surface of the substrate, a tenth impurity region with a tenth volume and a tenth surface area, the tenth impurity region being of the second type;
forming a third gate oxide between a source region and a drain region of the third transistor;
covering the third gate oxide with a third conductive material;
implanting, into the source region of the third transistor, an eleventh impurity region with an eleventh volume and an eleventh surface area, the eleventh impurity region being of the first type; and
implanting, into the drain region of the third transistor, a twelfth impurity region with a twelfth volume and a twelfth surface area, the twelfth impurity region being of the first type.

24. The method of claim 23, wherein the first gate oxide, the second gate oxide and the third gate oxide are concurrently formed such that the first transistor, the second transistor and the third transistor have a similar threshold voltage and gate oxide thickness.

25. The method of claim 23, wherein the first gate oxide is formed at a different time than the second gate oxide and the third gate oxide.

26. The method of claim 23, wherein the first gate oxide, the second gate oxide and the third gate oxide have a same gate oxide thickness.

27. The method of claim 23, wherein the first gate oxide has a different gate oxide thickness than that of the second gate oxide or the third gate oxide.

28. The method of claim 23, wherein forming a first gate oxide includes forming the first gate oxide separately from and prior to formation of the second gate oxide and the third gate oxide.

29. The method of claim 23, wherein forming a sixth impurity region includes forming the sixth impurity region after formation of the second gate oxide and the third gate oxide.

30. The method of claim 23, wherein the first impurity region includes a high voltage n-type well lightly doped relative to a CMOS n-type well.

31. The method of claim 23, wherein the first impurity region includes a CMOS n-type well.

32. The method of claim 23, wherein the sixth impurity region includes a CMOS n-type well.

33. The method of claim 23, wherein the sixth impurity region includes a double doped drain.

34. The method of claim 23, wherein the sixth impurity region includes a lightly doped drain.

35. The method of claim 23, wherein implanting the second impurity region includes:
 a first implant to limit a vertical depth of the second impurity region; and
 a second implant separate from the first implant to control a lateral channel length of the transistor.

36. The method of claim 35, wherein the first implant and the second implant occur after formation of the second gate oxide and the third gate oxide.

37. The method of claim 21, further comprising implanting, into the source region of the first transistor, a thirteenth impurity region with a thirteenth volume and a thirteenth surface area, the thirteenth impurity region being of the first type.

38. The method of claim 37, wherein the thirteenth impurity region is adjacent to the third impurity region and extends beneath the first gate oxide.

39. The method of claim 21, wherein the first transistor is a p-type LDMOS transistor.

40. The method of claim 21, wherein the portion of the n-doped lightly doped drain further extends beneath a portion of the gate oxide.

41. A method of fabricating a transistor having a source region, a drain region and a gate region on a substrate, the method comprising:
 implanting, into a surface of the substrate, a first impurity region with a first volume and a first surface area, the first impurity region being of a first type;
 implanting, into the source region of the transistor, a second impurity region with a second volume and a second surface area, the second impurity region being of an opposite second type relative to the first type;
 forming a gate oxide between the source region and the drain region of the transistor prior to implanting the second impurity region;
 covering the gate oxide with a conductive material;
 implanting, into the source region of the transistor, a third impurity region with a third volume and a third surface area and a fourth impurity region with a fourth volume and a fourth surface area, the third impurity region being of the first type, the fourth impurity region being of the opposite second type;
 implanting, into the drain region of the transistor, a fifth impurity region with a fifth volume and a fifth surface area, the fifth impurity region being of the first type; and
 implanting, into the drain region of the transistor, a plurality of sixth impurity regions each having a sixth volume and a sixth surface area, and is distanced apart from other sixth impurity regions along the first surface of the substrate, the sixth impurity region closest to the gate oxide being implanted with a spacing from the second impurity region, each sixth impurity region being of the first type.

* * * * *